United States Patent
Wheland

(12) 
(10) Patent No.: US 9,321,861 B2
(45) Date of Patent: Apr. 26, 2016

(54) AZO-CROSSLINKED FLUOROPOLYMER WITH PERFLUOROETHER PENDANT GROUPS, PROCESS FOR PREPARING, AND METHOD FOR FORMING IMAGED ARTICLE THEREWITH

(71) Applicant: E. I. DU PONT DE NEMOURS AND COMPANY, Wilmington, DE (US)

(72) Inventor: Robert Clayton Wheland, Wilmington, DE (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 0 days.

(21) Appl. No.: 14/428,693

(22) PCT Filed: Sep. 26, 2013

(86) PCT No.: PCT/US2013/061869
§ 371 (c)(1),
(2) Date: Mar. 17, 2015

(87) PCT Pub. No.: WO2014/052556
PCT Pub. Date: Apr. 3, 2014

(65) Prior Publication Data
US 2015/0246984 A1    Sep. 3, 2015

Related U.S. Application Data

(60) Provisional application No. 61/706,854, filed on Sep. 28, 2012, provisional application No. 61/706,885, filed on Sep. 28, 2012, provisional application No. 61/706,842, filed on Sep. 28, 2012.

(51) Int. Cl.
| | |
|---|---|
| *G03F 7/038* | (2006.01) |
| *C08F 14/26* | (2006.01) |
| *G03F 7/004* | (2006.01) |
| *C08F 214/18* | (2006.01) |
| *C08F 214/26* | (2006.01) |
| *B05D 3/06* | (2006.01) |
| *C08L 27/24* | (2006.01) |

(52) U.S. Cl.
CPC .............. *C08F 14/26* (2013.01); *B05D 3/067* (2013.01); *C08F 214/18* (2013.01); *C08F 214/182* (2013.01); *C08F 214/26* (2013.01); *C08L 27/24* (2013.01); *G03F 7/0046* (2013.01); *G03F 7/038* (2013.01)

(58) Field of Classification Search
CPC .. C08F 214/18; C08F 214/182; C08F 214/26; C08F 14/26; C08L 27/24; G03F 7/0046; G03F 7/038
USPC .................. 430/18, 270.1; 522/109; 427/508; 525/326.3

See application file for complete search history.

(56) References Cited

U.S. PATENT DOCUMENTS

| | | | |
|---|---|---|---|
| 4,129,531 A | 12/1978 | Rauer et al. | |
| 4,409,393 A | 10/1983 | Squire | |
| 4,935,477 A | 6/1990 | Squire | |
| 5,032,572 A * | 7/1991 | Saffran ................ | A61K 9/0092 514/10.3 |
| 5,447,993 A | 9/1995 | Logothetis | |
| 5,789,489 A | 8/1998 | Coughlin et al. | |
| 5,831,131 A | 11/1998 | Krespan et al. | |
| 7,989,566 B2 | 8/2011 | Coughlin et al. | |

FOREIGN PATENT DOCUMENTS

| | | | |
|---|---|---|---|
| CN | 101350413 A * | 1/2009 | |
| EP | 710645 A1 | 5/1996 | |
| EP | 729940 A2 | 9/1996 | |
| GB | 2009183 A | 6/1979 | |
| WO | WO 2012/009398 A1 * | 1/2012 | |

OTHER PUBLICATIONS

Gambaretto et al., "The Reactions of Chlorine Monofluoride With Unsaturated Compounds and the Dehydrohalogenation of Some of the Derivatives", J. Fluorine Chem. 7, 569 (1976).
Hynes et al., "The Addition of Chlorine Monofluoride to Fluorinated Nitriles", Inorganic Chemistry, 5 (3) 488-489 (Mar. 1966).
Scherer, Jr. et al., "Synthesis and Pyrolysis of Perfluoroazo-2-propane", International Journal of Kinetics, 26, 73(1994).
International Search Report for International Application No. PCT/US2013/061869, Filed Sep. 26, 2013.

* cited by examiner

Primary Examiner — John A McPherson

(57) ABSTRACT

This invention pertains to an azo-crosslinked fluoropolymer with perfluoroether pendant groups. The polymer so formed is highly useful in the form of shaped articles with excellent chemical and thermal stability, including photoimaged coatings. The azo-crosslinked fluoropolymer hereof is advantageously formed by exposure to UV radiation of a fluorinated polymer having dichloroamino-functionalized perfluoroether pendant groups. In one embodiment, a fluorinated polymer having dichloroamino-functionalized perfluoroether pendant groups is formed into a shaped article that is then UV-treated in situ.

18 Claims, 4 Drawing Sheets

AZO-CROSSLINKED FLUOROPOLYMER WITH PERFLUOROETHER PENDANT GROUPS, PROCESS FOR PREPARING, AND METHOD FOR FORMING IMAGED ARTICLE THEREWITH

CLAIM OF PRIORITY

The present invention claims priority to U.S. Provisional Patent Application 61/706,842, entitled "Azo-Crosslinked Fluoropolymer With Perfluoroether Pendant Groups" filed on Sep. 28, 2012; U.S. Provisional Patent Application 61/706,854, entitled "Process For Preparing An Azo-Crosslinked Fluoropolymer With Perfluoroether Pendant Groups By Uv-Irradiation," filed on Sep. 28, 2012; and, U.S. Provisional Patent Application 61/706,885, entitled "Process For Preparing Imaged Article Using Substrate Coated With Fluoropolymer Having Dichloroamino-Functionalized Perfluoroether Pendant Group," filed on Sep. 28, 2012.

FIELD OF THE INVENTION

This invention pertains to an azo-crosslinked fluoropolymer with perfluoroether pendant groups, a process for preparing said azo-crosslinked fluoropolymer by UV irradiation of a dichloroamino-functionalized perfluoroether pendant group that terminates in —$CF_2NCl_2$. The invention also pertains to a method for forming an imaged article therewith.

BACKGROUND

Hynes et al., *inorganic Chemistry*, 5 (3) 488-489 (March 1966), disclose compositions of the formula $R_fCF_2NCl_2$ wherein $R_f$ is $CF_3$ or $C_2F_5$. They also disclose $CClF_2CF_2NCl_2$, and $NCl_2CF_2CF_2CF_2NCl_2$. Further disclosed is a process for synthesizing those species by reacting at −78° C. the condensed vapors of, respectively, $C_2F_5CN$, $C_3F_7CN$, CCl—$F_2CN$, and $CF_2(CN)_2$, with Cl—F, followed by warming to 0° C. Further disclosed is the pyrolytic transformation at ca. 200° C. of the fluorinated chloroamines to azo compounds represented, inter alia, by the structure $R_fCF_2N$=$NCF_2R_f$ where $R_f$ is $CF_3$, $C_2F_5$, or CCl—$F_2$, as well as a cyclic structure when the starting material was $NCl_2CF_2CF_2CF_2NCl_2$. The subsequent thermolysis of azo $R_fCF_2N$=$NCF_2R_f$ has been reported to follow multiple reaction paths (Scherer, Jr. et al., International Journal of Kinetics, 26, 73(1994)).

Logothetis, U.S. Pat. No. 5,447,993 discloses nitrile containing fluoroelastomers that are copolymers of tetrafluoroethylene, a perfluoro(alkyl vinyl ether) and a nitrile containing cure site monomer. Particularly preferred is the cure site monomer represented by the structure $CF_2$=$CFOCF_2CF(CF_3)OCF_2CF_2CN$ Also disclosed in Logothetis is a process for crosslinking the nitrile-containing fluoroelastomer comprising using a tin catalyst capable of catalyzing the crosslinking, a peroxide, and a diene or triene coagent, the process comprising heating first to 150 to 220° C. followed by further heating to 250 to 310° C. The second heating is said to produce a cured sample that is thermally stable.

SUMMARY OF THE INVENTION

In one aspect the invention provides a dichloroamino-functionalized polymer having a backbone chain comprising fluoroalkylene repeat units optionally substituted by ether oxygen, and a molar concentration of 0.5 to 50 mol-% of repeat units represented by Structure I

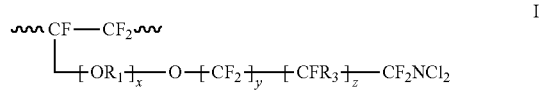

where x is an integer in the range of 0 to 3, y is an integer in the range of 0 to 6, and z is an integer in the range of 0 to 3; $R_1$=$(CF_2)_aCFR_2$, where a is an integer in the range of 0 to 6, and $R_2$ is F or $C_{1-6}$ perfluoroalkyl optionally substituted by ether oxygen; $R_3$ is F or $C_{1-6}$ perfluoroalkyl optionally substituted by ether oxygen; with the proviso that y and z cannot both be zero; and, with the further proviso that no repeat unit in the backbone chain of said dichloroamino-functionalized polymer has more than two vinyl hydrogens attached thereto; and, wherein said dichloroamino-functionalized polymer has no crystalline melting point above 180° C. that is associated with a latent heat of melting greater than 1 J/g.

In another aspect, the invention provides a Cl—F addition process comprising combining, at a temperature in the range of 20 to 150° C., Cl—F with a cyano-functionalized polymer comprising fluoroalkylene repeat units optionally substituted by ether oxygen, and a molar concentration of 0.5 to 50 mol-% of repeat units represented by Structure II

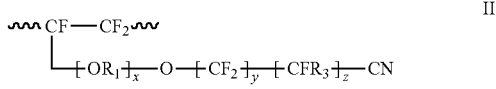

where x is an integer in the range of 0 to 3, y is an integer in the range of 0 to 6, and z is an integer in the range of 0 to 3; $R_1$=$(CF_2)_aCFR_2$, where a is an integer in the range of 0 to 6, and $R_2$ is F or $C_{1-6}$ perfluoroalkyl optionally substituted by ether oxygen; and $R_3$ is F or $C_{1-6}$ perfluoroalkyl optionally substituted by ether oxygen; with the proviso that y and z cannot both be zero; and, with the further proviso that no repeat unit in the backbone chain of said cyano-functionalized polymer has more than two vinyl hydrogens attached thereto.

In another aspect the invention provides an azo-crosslinked polymer represented by Structure III

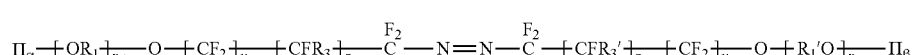

wherein each of $\Pi_\alpha$ and $\Pi_\beta$ is a polymeric radical having a backbone chain comprising fluoroalkylene repeat units optionally substituted by ether oxygen, and azo-crosslinked repeat units at a molar concentration in the range of 0.5 to 50 mol-%; where $x_1$ and $x_2$ each independently is an integer in the range of 0 to 3; $y_1$ and $y_2$ each independently is an integer in the range of 0 to 6, and $z_1$ and $z_2$ each independently is an integer in the range of 0 to 3; $R_1=(CF_2)_aCFR_2$, where a is an integer in the range of 0 to 6, and $R_2$ is F or $C_{1-6}$ perfluoroalkyl optionally substituted by ether oxygen; $R_1'=(CF_2)_{a'}CFR_2'$ where a' is an integer in the range of 0 to 6, and $R_2'$ is F or $C_{1-6}$ perfluoroalkyl optionally substituted by ether oxygen; and, $R_3$ and $R_3'$ are each independently F or $C_{1-6}$ perfluoroalkyl optionally substituted by ether oxygen; with the proviso that $y_1$ and $z_1$ cannot both be zero; with the further proviso that $y_2$ and $z_2$ cannot both be zero; with the further proviso that no repeat unit in the backbone chain of said $\Pi_\alpha$ and $\Pi_\beta$ polymeric radicals has more than two vinyl hydrogens attached thereto; and, with the further proviso that $\Pi_\alpha$ and $\Pi_\beta$ can be the same or different.

In another aspect, the invention provides an azo formation process comprising combining a first dichloroamino-functionalized polymer having a first backbone chain and a second dichloroamino-functionalized polymer having a second backbone chain to form a reaction mixture, and subjecting said thus formed reaction mixture to exposure to ultra-violet irradiation, at least a portion of which lies in the wavelength range from 200 to 425 nm for a period of time sufficient to convert at least a portion of said first and second polymers into a crosslinked product, each said first and second backbone chains comprising fluoroalkylene repeat units optionally substituted by ether oxygen, and a molar concentration in the range of a molar concentration of 0.5 to 50 mol-% of dichloroamino-functionalized repeat units represented by Structure I

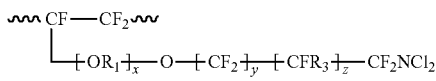

where x is an integer in the range of 0 to 3, y is an integer in the range of 0 to 6, and z is an integer in the range of 0 to 3; $R_1=(CF_2)_aCFR_2$, where a is an integer in the range of 0 to 6, and $R_2$ is F or $C_{1-6}$ perfluoroalkyl optionally substituted by ether oxygen; $R_3$ is F or $C_{1-6}$ perfluoroalkyl optionally substituted by ether oxygen; with the proviso that y and z cannot both be zero; and, with the further proviso that no repeat unit in the backbone chain of said dichloroamino-functionalized polymer has more than two vinyl hydrogens attached thereto; and, wherein said dichloroamino-functionalized polymer has no crystalline melting point above 180° C. that is associated with a latent heat of melting greater than 1 J/g; and, wherein said first polymer and said second polymer can be the same or different.

In still another aspect, the invention provides a crosslink stabilization process comprising subjecting an azo-crosslinked polymer to a temperature in the range of 200 to 350° C. for a period of time sufficient to convert at least a portion of said azo crosslinked polymer to a perfluoroalkyl-crosslinked polymeric structure; said azo-crosslinked polymer represented by Structure III

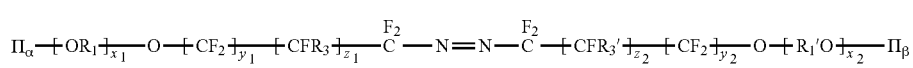

wherein each of $\Pi_\alpha$ and $\Pi_\beta$ is a polymeric radical having a backbone chain comprising fluoroalkylene repeat units optionally substituted by ether oxygen, and azo-crosslinked repeat units at a molar concentration in the range of a molar concentration of 0.5 to 50 mol-%; where $x_1$ and $x_2$ each independently is an integer in the range of 0 to 3; $y_1$ and $y_2$ each independently is an integer in the range of 0 to 6, and $z_1$ and $z_2$ each independently is an integer in the range of 0 to 3; $R_1=(CF_2)_aCFR_2$, where a is an integer in the range of 0 to 6, and $R_2$ is F or $C_{1-6}$ perfluoroalkyl optionally substituted by ether oxygen; $R_1'=(CF_2)_aCFR_2'$ where a' is an integer in the range of 0 to 6, and $R_2'$ is F or $C_{1-6}$ perfluoroalkyl optionally substituted by ether oxygen; and, $R_3$ and $R_3'$ are each independently F or $C_{1-6}$ perfluoroalkyl optionally substituted by ether oxygen; with the proviso that $y_1$ and $z_1$ cannot both be zero; with the further proviso that $y_2$ and $z_2$ cannot both be zero; with the further proviso that no repeat unit in the backbone chain of said $\Pi_\alpha$ and $\Pi_\beta$ polymeric radicals has more than two vinyl hydrogens attached thereto; and, with the further proviso that $\Pi_\alpha$ and $\Pi_\beta$ can be the same or different.

In another aspect, the invention provides a perfluoroalkyl-crosslinked polymer comprising a fluorocarbon crosslinked polymer represented by Structure IV

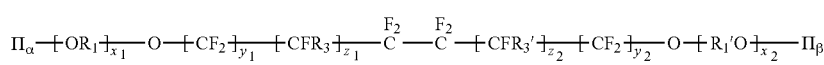

wherein each of $\Pi_\alpha$ and $\Pi_\beta$ is a polymeric radical having a backbone chain comprising fluoroalkylene repeat units optionally substituted by ether oxygen, and perfluoroalkyl-crosslinked repeat units at a molar concentration in the range of a molar concentration of 0.5 to 50 mol-%; where $x_1$ and $x_2$ each independently is an integer in the range of 0 to 3; $y_1$ and $y_2$ each independently is an integer in the range of 0 to 6, and $z_1$ and $z_2$ each independently is an integer in the range of 0 to 3; $R_1=(CF_2)_aCFR_2$, where a is an integer in the range of 0 to 6, and $R_2$ is F or $C_{1-6}$ perfluoroalkyl optionally substituted by ether oxygen; $R_1'=(CF_2)_aCFR_2'$ where a' is an integer in the range of 0 to 6, and $R_2'$ is F or $C_{1-6}$ perfluoroalkyl optionally substituted by ether oxygen; and, $R_3$ and $R_3'$ are each independently F or $C_{1-6}$ perfluoroalkyl optionally substituted by ether oxygen; with the proviso that $y_1$ and $z_1$ cannot both be zero; with the further proviso that $y_2$ and $z_2$ cannot both be zero; with the further proviso that no repeat unit in the backbone chain of said $\Pi_\alpha$ and $\Pi_\beta$ polymeric radicals has more than two vinyl hydrogens attached thereto; and, with the further proviso that $\Pi_\alpha$ and $\Pi_\beta$ can be the same or different.

In another aspect, the invention provides for A process comprising forming a reaction mixture by adding Cl—F, at a temperature in the range of room temperature to 100° C., to an evacuated vessel containing a cyano-functionalized polymer comprising a backbone chain comprising repeat units of tetrafluoroethylene, perfluoromethylvinyl ether, and a molar concentration in the range of 0.5 to 5 mol-% of repeat units represented by Structure VI

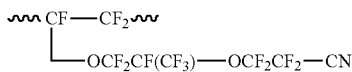

(VI)

wherein said cyano-functionalized polymer has no crystalline melting point above 180° C. that is associated with a latent heat of melting greater than 1 J/g; subjecting said reaction mixture to heating to a temperature in the range of 250 to 300° C.; removing residual Cl—F following the step of heating in the range 250 to 300° C., followed by further heating the polymer to a temperature in the range of >300 to 350° C. in an inert atmosphere.

In still another aspect, the present invention provides an imageable article comprising a substrate having a surface, and an imageable film disposed upon said surface, said imageable film comprising a dichloroamino-functionalized polymer comprising fluoroalkylene repeat units optionally substituted by ether oxygen, and a molar concentration in the range of a molar concentration of 0.5 to 50 mol-% of repeat units represented by Structure I

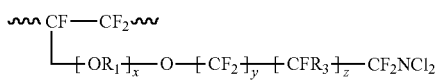

(I)

where x is an integer in the range of 0 to 3, y is an integer in the range of 0 to 6, and z is an integer in the range of 0 to 3; $R_1=(CF_2)_a CFR_2$, where a is an integer in the range of 0 to 6, and $R_2$ is F or $C_{1-6}$ perfluoroalkyl optionally substituted by ether oxygen; $R_3$ is F or $C_{1-6}$ perfluoroalkyl optionally substituted by ether oxygen; with the proviso that y and z cannot both be zero; and, with the further proviso that no repeat unit in the backbone chain of said dichloroamino-functionalized polymer has more than two vinyl hydrogens attached thereto; and, wherein said dichloroamino-functionalized polymer has no crystalline melting point above 180° C. that is associated with a latent heat of melting greater than 1 J/g.

In a further aspect the invention provides a method comprising imagewise exposing an imageable article to ultraviolet light at least a portion of which lies in the wavelength range from 200 to 425 nanometers; and, subjecting the thus imagewise exposed imaged article to image development, thereby producing an imaged article; wherein said imageable article comprises a substrate having a surface, and an imageable film disposed upon said substrate, said imageable film comprising a dichloroamino-functionalized polymer comprising fluoroalkylene repeat units optionally substituted by ether oxygen, and a molar concentration of 0.5 to 50 mol-% of repeat units represented by Structure I

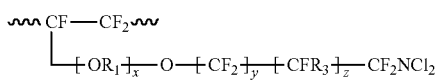

(I)

where x is an integer in the range of 0 to 3, y is an integer in the range of 0 to 6, and z is an integer in the range of 0 to 3; $R_1=(CF_2)_a CFR_2$, where a is an integer in the range of 0 to 6, and $R_2$ is F or $C_{1-6}$ perfluoroalkyl optionally substituted by ether oxygen; $R_3$ is F or $C_{1-6}$ perfluoroalkyl optionally substituted by ether oxygen; with the proviso that y and z cannot both be zero; and, with the further proviso that no repeat unit in the backbone chain of said dichloroamino-functionalized polymer has more than two vinyl hydrogens attached thereto; and, wherein said dichloroamino-functionalized polymer has no crystalline melting point above 180° C. that is associated with a latent heat of melting greater than 1 J/g.

In another aspect, the present invention provides an imaged article comprising a substrate having a surface, and a crosslinked coating imagewise disposed upon said surface, said crosslinked coating comprising an azo-crosslinked polymer represented by Structure III

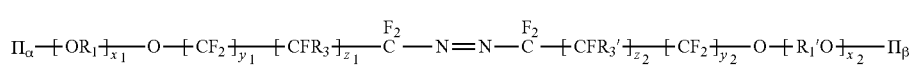

(III)

wherein each of $\Pi_\alpha$ and $\Pi_\beta$ is a polymeric radical having a backbone chain comprising fluoroalkylene repeat units optionally substituted by ether oxygen, and azo-crosslinked repeat units at a molar concentration in the range of a molar concentration of 0.5 to 50 mol-%; where $x_1$ and $x_2$ each independently is an integer in the range of 0 to 3; $y_1$ and $y_2$ each independently is an integer in the range of 0 to 6, and $z_1$ and $z_2$ each independently is an integer in the range of 0 to 3; $R_1=(CF_2)_a CFR_2$, where a is an integer in the range of 0 to 6, and $R_2$ is F or $C_{1-6}$ perfluoroalkyl optionally substituted by ether oxygen; $R_1'=(CF_2)_{a'} CFR_2'$ where a' is an integer in the range of 0 to 6, and $R_2'$ is F or $C_{1-6}$ perfluoroalkyl optionally substituted by ether oxygen; and, $R_3$ and $R_3'$ are each independently F or $C_{1-6}$ perfluoroalkyl optionally substituted by ether oxygen; with the proviso that $y_1$ and $z_1$ cannot both be zero; with the further proviso that $y_2$ and $z_2$ cannot both be zero; with the further proviso that no repeat unit in the backbone chain of said $\Pi_\alpha$ and $\Pi_\beta$ polymeric radicals has more than two vinyl hydrogens attached thereto; and, with the further proviso that $\Pi_\alpha$ and $\Pi_\beta$ can be the same or different.

BRIEF DESCRIPTION OF THE DRAWINGS

FIG. 2b shows an AFM sectional analysis of the pattern in FIG. 2a.

DETAILED DESCRIPTION

Figure 1:
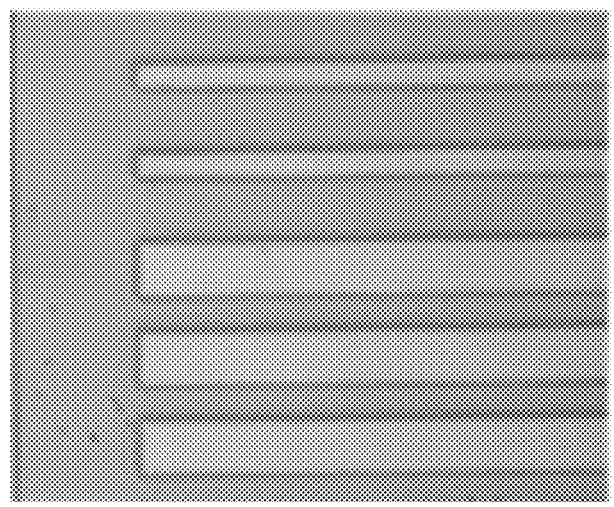
FIG. 1 is an optical photomicrograph showing ~20 and 50μ wide grooves developed after exposing the P5-CF2NCl2 film in Example 16 to UV light though a photomask.

When a range of values is provided herein, it is intended to encompass the end-points of the range unless specifically stated otherwise. Numerical values used herein have the precision of the number of significant figures provided, following the standard protocol in chemistry for significant figures as outlined in ASTM E29-08 Section 6. For example, the number 40 encompasses a range from 35.0 to 44.9, whereas the number 40.0 encompasses a range from 39.50 to 40.49.

The term "room temperature" shall be understood to mean that no external heating or cooling has been applied to the specimen in question. In general, room temperature for the purposes of this invention lies in the range of 20-35° C., most typically 23-30° C.

The terms "melting point," "melting endotherm," and "latent heat of melting" are employed herein in a manner consistent with common usage in the art of polymer science. Terminology is referenced to the results obtained by employing the thermal analytical technique of differential scanning calorimetry (DSC). Unlike crystalline small molecules, crystalline organic polymers exhibit melting over a range of temperatures, and the melting transition is characterized in a number of ways. The output of DSC analysis of an organic polymer describes a continuous curve that rises continuously from the base line, reaches a peak, and then falls gradually and continuously back to the baseline. That curve is referred to as a melting endotherm. For the purposes of the present invention, the temperature at which the melting endotherm reaches its peak is referred to herein as the "melting point" of the polymer. The integral of the melting endotherm corresponds to the latent heat of melting of the crystalline polymer. Thus each melting point is associated with a melting endotherm, and a latent heat of melting is associated with each melting point.

The polymers suitable for the processes disclosed herein are amorphous polymers, exhibiting no substantial amount of crystallinity. More particularly, a suitable polymer is one which exhibits no melting point at a temperature of >180° C. with an associated latent heat of melting greater than 1 J/g. Preferably, a suitable polymer is one which exhibits no melting point at a temperature of >150° C. with an associated latent heat of melting greater than 1 J/g.

The term "solvent soluble" is employed herein to describe some embodiments of the polymers described herein. By "solvent soluble" is meant that the indicated polymer is soluble in an organic solvent that is a liquid at room temperature. Particularly well-suited solvents are perfluorinated solvents. Suitable perfluorinated solvents include but are not limited to perfluoro-N-methylmorpholine, available commercially from the 3M Company as PF-5052, and Fluorinert® FC-40, also available from the 3M Company.

Disclosed herein is a novel, non-crosslinked fluoropolymer, comprising a perfluoroether pendant group comprising a —CF$_2$NCl$_2$ functional group, and the preparation thereof from a known polycyanofluorovinyl ether by treatment with Cl—F; the crosslinking thereof by exposure to ultra-violet (UV) to form a novel azo crosslinked polymer; and, a novel, highly thermally stable, crosslinked polymer comprising perfluoroalkylene crosslinks, and a plurality of methods for the preparation thereof. Further disclosed is the use of these polymers for preparing highly stable molded articles. Also disclosed is the imagewise exposure of these polymers to UV, and the preparation thereby of imaged articles.

Terms such as uncrosslinked and crosslinked shall be understood to refer to a preponderance of functional groups in a given polymer, but not necessarily, and not usually, to all. Thus, it shall be understood that when a polymer is described as uncrosslinked or "not substantially crosslinked" it means that a preponderance of the crosslinkable groups remain uncrosslinked, and that the properties of the polymer so characterized are characteristic of uncrosslinked polymers, such as by solubility, thermo-formability, dimensional stability (or, more precisely, instability), melt flowability, and such other properties such as are known in the art to pertain to uncrosslinked polymers.

It shall further be understood that when a polymer is described as crosslinked or "substantially crosslinked" it means that a preponderance of the crosslinkable groups originally available in the uncrosslinked polymer have undergone crosslinking and that the properties of the polymer so characterized are characteristic of crosslinked polymers, exhibiting differences vis a vis the corresponding uncrosslinked polymer, of reduced solubility, reduced thermo-formability, increased dimensional stability, and decreased melt flowability, as well as exhibiting such other properties as are known in the art to pertain to crosslinked polymers.

In several embodiments, chemical reaction is effected in situ in a polymeric shaped article. The total reaction time will depend directly upon the thickness of the shaped article, and inversely upon the surface to volume ratio thereof. Desirably, sufficient time is allowed for reactants to diffuse into the polymeric shaped article, and for by-products to diffuse out. The thicker the shaped article, the longer time for diffusion, other things being equal. Similar considerations hold for heating profiles. Excessively rapid heating can lead to foaming and blistering because reaction by-products cannot escape. The thicker the polymeric shaped article, the more gradual heating needs to be; so, heating time varies directly with thickness.

As a result, the heating time required in a given process step has been observed to vary very considerably. When the article being heated to effect crosslinking is a film that might be 25-100 micrometers thick, crosslinking may be effected to completion in the time range of 10 seconds to 10 minutes. On the other hand, if the article being crosslinked is on the order of 1000-5000 micrometers in thickness, as long as 30 hours might be required to achieve uniform and complete crosslinking.

It is common practice in the polymer art to refer to repeat units in polymer backbones according to the monomeric species from which the repeat unit has been formed. That practice will be employed herein. Thus, for example, the repeat unit in poly(tetrafluoro ethylene) is referred to as a tetrafluoroethylene (TFE) repeat unit, even though, in fact it is the diradical —CF$_2$—CF$_2$— that is incorporated into the backbone upon polymerization of the TFE.

In one aspect the invention provides a dichloroamino-functionalized polymer having a backbone chain comprising fluoroalkylene repeat units optionally substituted by ether oxygen, and a molar concentration of 0.5 to 50 mol-% of repeat units represented by Structure I

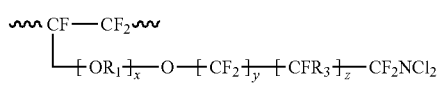

where x is an integer in the range of 0 to 3, y is an integer in the range of 0 to 6, and z is an integer in the range of 0 to 3; $R_1$=(CF$_2$)$_a$CFR$_2$, where a is an integer in the range of 0 to 6, and $R_2$ is F or $C_{1-6}$ perfluoroalkyl optionally substituted by ether oxygen; $R_3$ is F or $C_{1-6}$ perfluoroalkyl optionally substituted by ether oxygen; with the proviso that y and z cannot both be zero; and, with the further proviso that no repeat unit in the backbone chain of said dichloroamino-functionalized polymer has more than two vinyl hydrogens attached thereto;

and, wherein said dichloroamino-functionalized polymer has no crystalline melting point above 180° C. that is associated with a latent heat of melting greater than 1 J/g.

In one embodiment of the dichloroamino-functionalized polymer, x=1, y=1, z=1, a=1, $R_2$=$CF_3$; and $R_3$=F.

In one embodiment of the dichloroamino-functionalized polymer, the molar concentration of repeat units represented by Structure I is in the range of mol-%. In a further embodiment, the concentration of repeat units represented by Structure I is in the range of 0.5 to 5 mol-%.

In one embodiment, the dichloroamino-functionalized polymer further comprises repeat units of perfluoroalkyl vinyl ether (PAVE). In a further embodiment, the PAVE is perfluoromethyl vinyl ether (PMVE), perfluoroethyl vinyl ether (PEVE), perfluoropropyl vinyl ether (PPVE), perfluorobutyl vinyl ether (PBVE), or a combination of two or more thereof.

In one embodiment of the dichloroamino-functionalized polymer at least a portion of the fluoroalkylene repeat units are branched fluoroalkylene repeat units.

Suitable fluoroalkylene repeat units include but are not limited to those derived from tetrafluoroethylene (TFE), hexafluoropropylene (HFP), vinylidene fluoride ($VF_2$), perfluorodimethyldioxole (PDD), or a combination of two or more thereof. Particularly suitable are combinations of fluoroalkylene repeat units such as HFP with $VF_2$, and TFE with PDD.

In one embodiment, the dichloroamino-functionalized polymer has no crystalline melting point above 150° C. that is associated with a latent heat of melting greater than 1 J/g.

In one embodiment the dichloroamino-functionalized polymer is characterized by a backbone chain comprising repeat units of tetrafluoroethylene, perfluoromethylvinyl ether, and a molar concentration in the range of 0.5 to 5 mol-% of repeat units represented by Structure V

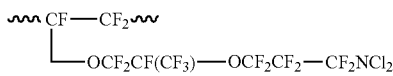

V wherein said dichloroamino-functionalized polymer has no crystalline melting point above 150° C. that is associated with a latent heat of melting greater than 1 J/g.

In another aspect, the invention provides a Cl—F addition process comprising combining, at a temperature in the range of room temperature to 100° C., Cl—F with a cyano-functionalized polymer comprising fluoroalkylene repeat units optionally substituted by ether oxygen, and a molar concentration of 0.5 to 50 mol-% of repeat units represented by Structure II

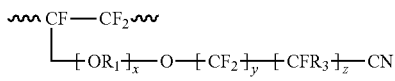

II where x is an integer in the range of 0 to 3, y is an integer in the range of 0 to 6, and z is an integer in the range of 0 to 3; $R_1$=$(CF_2)_a CFR_2$, where a is an integer in the range of 0 to 6, and $R_2$ is F or $C_{1-6}$ perfluoroalkyl optionally substituted by ether oxygen; and $R_3$ is F or $C_{1-6}$ perfluoroalkyl optionally substituted by ether oxygen; with the proviso that y and z cannot both be zero; and, with the further proviso that no repeat unit in the backbone chain of said dichloroamino-functionalized polymer has more than two vinyl hydrogens attached thereto.

In one embodiment of the Cl—F addition process, in the cyano-functionalized polymer, x=1, y=1, z=1, a=1, $R_2$=$CF_3$; and $R_3$=F. This particular repeat unit is derived from a monomer that shall be referred to herein as 8-CNVE.

In one embodiment of the Cl—F addition process, in the cyano-functionalized polymer, the molar concentration of repeat units represented by Structure II is in the range of 0.5 to 50 mol-%. In a further embodiment of the Cl—F addition process, in the cyano-functionalized polymer, the molar concentration of repeat units represented by Structure II is in the range of 0.5 to 5 mol-%.

In one embodiment, the polymer represented by Structure II is solvent soluble. In an alternative embodiment, the polymer represented by Structure II is melt processable. In a further embodiment, the polymer represented by Structure II is both solvent soluble and melt processable. A melt processible polymer is particularly well-suited for the formation of shaped articles by extrusion or molding. However, to be useful therein, the crosslinking rate needs to be slow relative to the length of time needed to form parts. For example, it is unlikely that a uniform, properly shaped o-ring could be molded if starting with a polymer that crosslinks faster at mold temperature than a dichloroamino-functionalized polymer of Structure I can melt flow and fill the mold. There are many variables to be considered including the mold temperature needed to achieve adequate melt flow which will in turn be impacted by polymer structure and molecular weight, the size and complexity of the parts to be molded, the concentration of —$NCl_2$ groups in the polymer and the inherent reactivity of those particular —$NCl_2$ groups at mold temperature. The specific conditions providing optimum yield, purity, properties and so forth for any particular polymer and part can be determined empirically according to the methods set out herein, such as by a design of experiment approach.

In the Cl—F addition process hereof, the reaction is conducted in a vessel with a pressure of Cl—F ranging from −6 to 200 psig. In one embodiment, the Cl—F pressure is in the range of 0 to 100 psig. In a further embodiment, the Cl—F pressure is in the range of 5 to 50 psig.

In one embodiment, the Cl—F addition process comprises combining, at a temperature in the range of 60 to 80° C., Cl—F at a pressure of 5 to 25 psig with a cyano-functionalized polymer having a backbone chain comprising repeat units of tetrafluoroethylene, perfluoromethylvinyl ether, and a molar concentration in the range of 0.5 to 5 mol-% of repeat units represented by Structure VI:

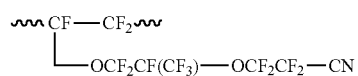

VI wherein said cyano-functionalized polymer has no crystalline melting point above 150° C. that is associated with a latent heat of melting greater than 1 J/g.

Example 14 shows how, in one particular embodiment, a small change in processing conditions results in the difference between being able to process (six minutes for a film at 190° C.) and not being able to process (6 minutes at 200° C.) a given polymer.

Suitable cyano-functionalized polymers of which many embodiments are solvent soluble, melt processable, or both, include but are not limited to:

TFE/PAVE/8-CNVE copolymers wherein the PAVE repeat unit is PMVE, PEVE, PPVE, PBVE, or a combination of two or more thereof, wherein the repeat unit derived from the PAVE is present at a concentration in the range of 18-49 mol %.

PDD/TFE/8-CNVE and PDD/8-CNVE copolymers wherein the PDD repeat unit is present in the backbone at a concentration in the range of 30 to 99 mol-%.

HFP/VF$_2$/8-CNVE copolymers wherein the HFP repeat unit is present in the backbone at a concentration in the range of 15 to 50 mol-%.

HFP/TFE/8-CNVE copolymers wherein the HFP repeat unit is present in the backbone at a concentration in the range of 25 to 35 mol-%.

Suitable cyano-functionalized polymers can be prepared according to methods of the art as taught in U.S. Pat. No. 7,989,566 and U.S. Pat. No. 5,789,489, and as described in the specific embodiments described infra.

The dichloroamino-functionalized polymer is readily formed into shaped articles, as well as coatings. In one embodiment of a shaped article, a solution of the dichloroamino-functionalized polymer is applied to the surface of a substrate, and the solvent volatilized, to form a photoimageable coating thereupon.

In an alternative embodiment, the dichloroamino-functionalized polymer here is melt formed into a shape by injection or compression molding, by extrusion, or such other means as are known in the art for the forming of shaped articles from thermoplastic polymers. In a further embodiment, the thus formed shaped article is subject to crosslinking as described in detail infra.

In another aspect the invention provides an azo-crosslinked polymer represented by Structure III

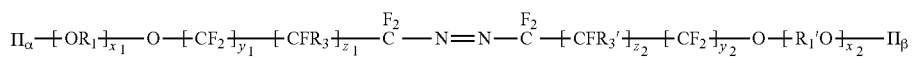

III wherein each of $\Pi_\alpha$ and $\Pi_\beta$ is a polymeric radical having a backbone chain comprising fluoroalkylene repeat units optionally substituted by ether oxygen, and azo-crosslinked repeat units at a molar concentration in the range of a molar concentration of 0.5 to 50 mol-%; where $x_1$ and $x_2$ each independently is an integer in the range of 0 to 3; $y_1$ and $y_2$ each independently is an integer in the range of 0 to 6, and $z_1$ and $z_2$ each independently is an integer in the range of 0 to 3; $R_1=(CF_2)_aCFR_2$, where a is an integer in the range of 0 to 6, and $R_2$ is F or $C_{1-6}$ perfluoroalkyl optionally substituted by ether oxygen; $R_1'=(CF_2)_{a'}CFR_2'$ where a' is an integer in the range of 0 to 6, and $R_2'$ is F or $C_{1-6}$ perfluoroalkyl optionally substituted by ether oxygen; and, $R_3$ and $R_3'$ are each independently F or $C_{1-6}$ perfluoroalkyl optionally substituted by ether oxygen; with the proviso that $y_1$ and $z_1$ cannot both be zero; with the further proviso that $y_2$ and $z_2$ cannot both be zero; with the further proviso that no repeat unit in the backbone chain of said $\Pi_\alpha$ and $\Pi_\beta$ polymeric radicals has more than two vinyl hydrogens attached thereto; and, with the further proviso that $\Pi_\alpha$ and $\Pi_\beta$ can be the same or different.

In one embodiment of the azo-crosslinked polymer, $\Pi_\alpha$ and $\Pi_\beta$ are the same.

In an alternative embodiment of the azo-crosslinked polymer, $\Pi_\alpha$ and $\Pi_\beta$ are different.

In one embodiment of the azo-crosslinked polymer, $\Pi_\alpha$ and $\Pi_\beta$ are the same, $x_1$, $x_2$, $y_1$, $y_2$, $z_1$, $z_2$, and a=1; $R_2$ and $R_2'$=$CF_3$; and $R_3$ and $R_3'$=F.

In determining herein the molar concentration of crosslinked units, each crosslinked unit is counted as two units in the crosslinked structure in order to keep the molar concentrations consistent from uncrosslinked structures to the corresponding crosslinked structure.

In one embodiment of the azo-crosslinked polymer the molar concentration of azo-crosslinked repeat units as represented in Structure III is in the range of 0.5 to 50 mol-%. In a further embodiment of the azo-crosslinked polymer the molar concentration of azo-crosslinked repeat units as represented in Structure III is in the range of 0.5 to 5 mol-%.

In one embodiment of the azo-crosslinked polymer at least one of $\Pi_\alpha$ and $\Pi_\beta$ further comprises PAVE repeat units. In a further embodiment, PAVE is PMVE, PEVE, PPVE, PBVE, or a combination of two or more thereof. In a still further embodiment, both $\Pi_\alpha$ and $\Pi_\beta$ further comprise PAVE repeat units.

In one embodiment of the azo-crosslinked polymer at least a portion of the fluoroalkylene repeat units are branched fluoroalkylene repeat units.

Suitable fluoroalkylene repeat units include but are not limited to those derived from tetrafluoroethylene (TFE), hexafluoropropylene (HFP), vinylidene fluoride (VF$_2$), and perfluorodimethyldioxole (PDD). Particularly suitable are combinations of fluoroalkylene repeat units such as such as HFP with VF$_2$, and TFE with PDD.

The azo-crosslinked polymer disclosed herein includes embodiments in which two or more azo-crosslinked polymers represented by Structure III are blended or otherwise mixed together before crosslinking.

In another aspect, the invention provides an azo formation process comprising combining a first dichloroamino-functionalized polymer having a first backbone chain and a second dichloroamino-functionalized polymer having a second backbone chain to form a reaction mixture, and subjecting said thus formed reaction mixture to exposure to ultra-violet irradiation, at least a portion of which lies in the wavelength range from 200 to 425 nm for a period of time sufficient to convert at least a portion of said first and second dichloroamino-functionalized polymers into a crosslinked product, each said first and second backbone chains of said first and second dichloroamino-functionalized polymers comprising fluoroalkylene repeat units optionally substituted by ether oxygen, and a molar concentration of 0.5 to 50 mol-% of repeat units represented by Structure I

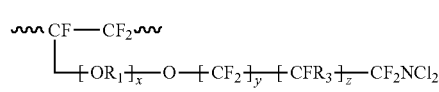

I where x is an integer in the range of 0 to 3, y is an integer in the range of 0 to 6, and z is an integer in the range of 0 to 3; $R_1=(CF_2)_aCFR_2$, where a is an integer in the range of 0 to 6, and $R_2$ is F or $C_{1-6}$ perfluoroalkyl optionally substituted by ether oxygen; $R_3$ is F or $C_{1-6}$ perfluoroalkyl optionally substituted by ether oxygen; with the proviso that y and z cannot both be zero; and, with the further proviso that no repeat unit in the backbone chain of said dichloroamino-functionalized polymer has more than two vinyl hydrogens attached thereto; and, wherein said dichloroamino-functionalized polymer has no crystalline melting point above 180° C. that is associated with a latent heat of melting greater than 1 J/g; and, wherein said first polymer and said second polymer can be the same or different.

In one embodiment of the azo-formation process, the first dichloroamino-functionalized polymer and the second dichloroamino-functionalized polymer are the same.

In an alternative embodiment of the azo-formation process, the first and the second dichloroamino-functionalized polymer are different.

Embodiments of the process include those in which three or more different polymers represented by Structure I are combined and reacted together to form the azo-crosslinked polymer.

In one embodiment of the azo-formation process, the UV irradiation lies within the wavelength range of 250-370 nm.

In one embodiment of the azo-formation process, said first and second polymers each independently have no crystalline melting point above 150° C. that is associated with a latent heat of melting greater than 1 J/g.

In one embodiment of the azo-formation process, the dichloroamino-functionalized polymer is characterized by a molar concentration of repeat units represented by Structure I in the range of 0.5 to 50 mol-%.

In one embodiment of the azo-formation process, the dichloroamino-functionalized polymer is that embodiment wherein $x=1$, $y=1$, $z=1$, $a=1$, $R_2=CF_3$; and $R_3=F$.

In one embodiment of the azo-formation process, the dichloroamino-functionalized polymer further comprises repeat units of PAVE. In a further embodiment, the PAVE is PMVE, PEVE, PPVE, PBVE, or a combination of two or more thereof.

In one embodiment of the azo-formation process, the dichloroamino-functionalized polymer comprises branched fluoroalkylene repeat units. Suitable fluoroalkylene repeat units include but are not limited to those derived from TFE, HFP, $VF_2$, and PDD. Particularly suitable are combinations of fluoroalkylene repeat units such as such as HFP with $VF_2$, and TFE with PDD.

Preferably the dichloroamino-functionalized polymer suitable for use in the azo-formation process is solvent soluble, melt processable, or both. For the purpose of brevity, in the list that follows, the relevant embodiments of the monomer unit represented by Structure I shall be designated as 8-$CF_2NCl_2$VE.

Suitable dichloroamino-functionalized polymers of which many embodiments are solvent soluble, melt processable, or both, include but are not limited to:

TFE/PAVE/8-$CF_2NCl_2$VE copolymers wherein the PAVE repeat unit is PMVE, PEVE, PPVE, PBVE, or a combination of two or more thereof, wherein the repeat unit derived from the PAVE is present at a concentration in the range of 18-49 mol %.

PDD/TFE/8-$CF_2NCl_2$VE and PDD/8-$CF_2NCl_2$VE copolymers wherein the PDD repeat unit is present in the backbone at a concentration in the range of 30 to 99 mol-%.

HFP/$VF_2$/8-$CF_2NCl_2$VE copolymers wherein the HFP repeat unit is present in the backbone at a concentration in the range of 15 to 50 mol-%.

HFP/TFE/8-$CF_2NCl_2$VE copolymers wherein the HFP repeat unit is present in the backbone at a concentration in the range of 25 to 35 mol-%.

In one embodiment of the azo formation process, the UV exposure is performed in an inert atmosphere. Suitable inert atmospheres include but are not limited to nitrogen, argon, helium or a mixture thereof.

In one embodiment, the azo formation process comprises subjecting to ultra-violet irradiation in the wave-length range from 250 to 370 nm, a dichloroamino-functionalized polymer having a backbone chain for a period of time sufficient to convert at least a portion of said dichloroamino-functionalized polymer into a crosslinked product; said backbone chain comprising repeat units of tetrafluoroethylene, perfluoromethylvinyl ether, and a molar concentration in the range of 0.5 to 5 mol-% of dichloroamino-functionalized repeat units represented by Structure V

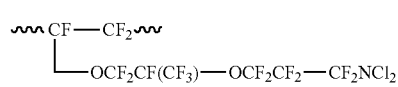

wherein said dichloroamino-functionalized polymer has no crystalline melting point above 150° C. that is associated with a latent heat of melting greater than 1 J/g.

In still another aspect, the invention provides a crosslink stabilization process comprising subjecting an azo crosslinked polymer to a temperature in the range of 250 to 350° C. for a period of time sufficient to convert at least a portion of said azo crosslinked polymer to a perfluoroalkyl-crosslinked polymeric structure; said azo-crosslinked polymer represented by Structure III

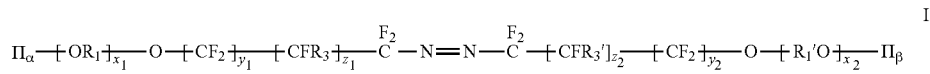

wherein each of $\Pi_\alpha$ and $\Pi_\beta$ is a polymeric radical having a backbone chain comprising fluoroalkylene repeat units optionally substituted by ether oxygen, and azo-crosslinked repeat units at a molar concentration in the range of a molar concentration of 0.5 to 50 mol-%; where $x_1$ and $x_2$ each independently is an integer in the range of 0 to 3; $y_1$ and $y_2$ each independently is an integer in the range of 0 to 6, and $z_1$ and $z_2$ each independently is an integer in the range of 0 to 3; $R_1=(CF_2)_aCFR_2$, where a is an integer in the range of 0 to 6, and $R_2$ is F or $C_{1-6}$ perfluoroalkyl optionally substituted by ether oxygen; $R_1'=(CF_2)_{a'}CFR_2'$ where a' is an integer in the range of 0 to 6, and $R_2'$ is F or $C_{1-6}$ perfluoroalkyl optionally substituted by ether oxygen; and, $R_3$ and $R_3'$ are each independently F or $C_{1-6}$ perfluoroalkyl optionally substituted by ether oxygen; with the proviso that $y_1$ and $z_1$ cannot both be zero; with the further proviso that $y_2$ and $z_2$ cannot both be zero; with the further proviso that no repeat unit in the backbone chain of said $\Pi_\alpha$ and $\Pi_\beta$ polymeric radicals has more than two vinyl hydrogens attached thereto; and, with the further proviso that $\Pi_\alpha$ and $\Pi_\beta$ can be the same or different.

In one embodiment, the crosslink stabilization process is conducted in an inert atmosphere. Suitable inert atmospheres include nitrogen, argon, helium or a mixture thereof.

It has been found that the conversion of the azo crosslink to the perfluoroalkenyl crosslink (—$CF_2CF_2$—) first becomes apparent in ATR spectra around 200° C. Conversion of the azo-crosslinked polymer to the —$CF_2CF_2$— crosslinked polymer is preferably effected in the temperature range of 250 to 350° C., most preferably in the temperature range of 300 to 350° C. Less than complete conversion of the azo to the perfluoroalkenyl —$CF_2CF_2$— crosslink results in a crosslinked polymer that can be both thermally and hydrolytically unstable. The instability can be dimensional, hydrolytic, or both. The perfluoroalkenyl-crosslinked polymeric structure produced in the crosslink stabilization process remains relatively inert to thermal exposure between room temperature and about 380 to 390° C. and to chemical exposure such as water to at least 325° C.

While the operability of the crosslink stabilization process is not limited by any particular chemical mechanism, there is strong chemical evidence, as demonstrated in the specific embodiments provided infra, that the crosslink stabilization process causes the conversion of the azo-crosslinked polymer to the corresponding perfluoroalkenyl-crosslinked polymer represented by Structure IV, described infra, by driving off the nitrogens.

In one embodiment, the crosslink stabilization process comprises subjecting azo-crosslinked polymer to a temperature in the range of 300 to 350° C. for a period of time sufficient to convert at least a portion of said azo crosslinked polymer to a perfluoroalkyl-crosslinked polymeric structure; said azo-crosslinked polymer represented by Structure VII:

two vinyl hydrogens attached thereto; and, with the further proviso that $\Pi_\alpha$ and $\Pi_\beta$ can be the same or different.

In one embodiment of the perfluoroalkenyl-crosslinked polymer, $\Pi_\alpha$ and $\Pi_\beta$ are the same.

In an alternative embodiment of the perfluoroalkenyl-crosslinked polymer, $\Pi_\alpha$ and $\Pi_\beta$ are different.

The perfluoroalkenyl-crosslinked polymer includes embodiments in which two or more perfluoroalkenyl-crosslinked polymers represented by Structure III are combined in a blend.

In one embodiment of the perfluoroalkenyl-crosslinked polymer, $\Pi_\alpha$ and $\Pi_\beta$ are the same, $x_1, x_2, y_1, y_2, z_1, z_2$, a and a'=1; $R_2$ and $R_2'$=$CF_3$; and $R_3$ and $R_3'$=F.

In one embodiment of the perfluoroalkenyl-crosslinked polymeric structure the molar concentration of perfluoroalkenyl-crosslinked repeat units is in the range of 0.5 to 5 mol-%.

In one embodiment, the perfluoroalkenyl-crosslinked polymer $\Pi_\alpha$ and $\Pi_\beta$ are the same and each further comprises PAVE repeat units. In a further embodiment, PAVE ether is PMVE, PEVE, PPVE, PBVE, or a combination of two or more thereof.

In one embodiment of the perfluoroalkenyl-crosslinked polymer at least a portion of the fluoroalkenyl repeat units are branched fluoroalkenyl repeat units. Suitable fluoroalkenyl repeat units include but are not limited to those derived from tetrafluoroethylene (TFE), hexafluoropropylene (HFP), vinylidene fluoride ($VF_2$), and perfluorodimethyldioxole (PDD). Particularly suitable are combinations of fluoroalkenyl repeat units such as such as HFP with $VF_2$, and TFE with PDD.

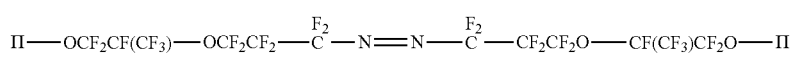

VII wherein π is a polymeric radical having a backbone chain comprising repeat units of tetrafluoroethylene, perfluoromethylvinyl ether, and azo-crosslinked repeat units at a molar concentration of 0.5 to 5 mol-%.

In another aspect, the invention provides a perfluoroalkenyl-crosslinked polymer represented by Structure IV The perfluoroalkenyl-crosslinked polymer exhibits a high degree of thermal and hydrolytic stability. The properties of a shaped article formed thereof are observed to vary desirably little upon heating said shaped article from room temperature to 350-390° C. Hydrolytic stability at 325° C. is excellent.

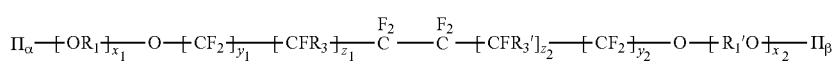

IV wherein each of $\Pi_\alpha$ and $\Pi_\beta$ is a polymeric radical having a backbone chain comprising fluoroalkylene repeat units optionally substituted by ether oxygen, and perfluoroalkenyl-crosslinked repeat units at a molar concentration in the range of a molar concentration of 0.5 to 50 mol-%; where $x_1$ and $x_2$ each independently is an integer in the range of 0 to 3; $y_1$ and $y_2$ each independently is an integer in the range of 0 to 6, and $z_1$ and $z_2$ each independently is an integer in the range of 0 to 3; $R_1$=$(CF_2)_a CFR_2$, where a is an integer in the range of 0 to 6, and $R_2$ is F or $C_{1-6}$ perfluoroalkyl optionally substituted by ether oxygen; $R_1'$=$(CF_2)_{a'}CFR_2'$ where a' is an integer in the range of 0 to 6, and $R_2'$ is F or $C_{1-6}$ perfluoroalkyl optionally substituted by ether oxygen; and, $R_3$ and $R_3'$ are each independently F or $C_{1-6}$ perfluoroalkyl optionally substituted by ether oxygen; with the proviso that $y_1$ and $z_1$ cannot both be zero; with the further proviso that $y_2$ and $z_2$ cannot both be zero; with the further proviso that no repeat unit in the backbone chain of said $\Pi_\alpha$ and $\Pi_\beta$ polymeric radicals as more than In another aspect, the invention provides for a direct crosslinking process comprising forming a reaction mixture by adding Cl—F, at a temperature in the range of room temperature to 100° C., to a first cyano-functionalized polymer and a second cyano-functionalized polymer, which may be the same or different, each said polymer comprising a backbone chain, and wherein each said backbone chain comprises fluoroalkylene repeat units optionally substituted by ether oxygen, and a molar concentration in the range of a molar concentration of 0.5 to 50 mol-% of repeat units represented by Structure II

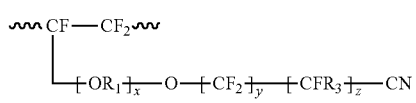

II where x is an integer in the range of 0 to 3, y is an integer in the range of 0 to 6, and z is an integer in the range of 0 to 3;

$R_1=(CF_2)_aCFR_2$, where a is an integer in the range of 0 to 6, and $R_2$ is F or $C_{1-6}$ perfluoroalkyl optionally substituted by ether oxygen; and $R_3$ is F or $C_{1-6}$ perfluoroalkyl optionally substituted by ether oxygen; with the proviso that y and z cannot both be zero; and, with the further proviso that no repeat unit in the backbone chain of said cyano-functionalized polymer has more than two vinyl hydrogens attached thereto; and, subjecting said reaction mixture to heating to a temperature in the range of 250 to 300° C.; with the proviso that said first and second cyano-functionalized polymers can be the same or different.

While not strictly necessary, it is highly preferred that in the direct crosslinking process, the cyano-functionalized polymer first be added to a vessel, the vessel be evacuated, and then the Cl—F introduced, followed by heating to 250 to 300° C.

Some embodiments of the process include those in which three or more different polymers represented by Structure II are combined and reacted together to form the direct-crosslinked polymer.

In a further aspect, to further enhance the thermal and chemical stability in the thus formed crosslinked polymer, the direct crosslinking process further comprises the steps of removing residual Cl—F following the step of heating to 250 to 300° C., followed by further heating the thus formed crosslinked polymer to a temperature in the range of >300 to 350° C.

In one embodiment heating in the range of >300-350° C. is effected in an inert atmosphere.

In one embodiment of the direct crosslinking process, in the cyano-functionalized polymer, x=1, y=1, z=1, a=1, $R_2$=CF$_3$; and $R_3$=F. This particular repeat unit is derived from a monomer that shall be referred to herein as 8-CNVE.

In one embodiment of the direct crosslinking process, in the cyano-functionalized polymer, the molar concentration of repeat units represented by Structure II is in the range of 0.5 to 5 mol-%.

Cyano-functionalized polymers particularly suitable for use in the direct crosslinking process by virtue of there being many embodiments that are solvent soluble, melt processible, or both, include but are not limited to:

TFE/PAVE/8-CNVE copolymers wherein the PAVE repeat unit is PMVE, PEVE, PPVE, PBVE, or a combination of two or more thereof, wherein the repeat unit derived from the PAVE is present at a concentration in the range of 18-49 mol %.

PDD/TFE/8-CNVE and PDD/8-CNVE copolymers wherein the PDD repeat unit is present in the backbone at a concentration in the range of 30 to 99 mol-%.

HFP/VF$_2$/8-CNVE copolymers wherein the HFP repeat unit is present in the backbone at a concentration in the range of 15 to 50 mol-%.

HFP/TFE/8-CNVE copolymers wherein the HFP repeat unit is present in the backbone at a concentration in the range of 25 to 35 mol-%.

In one embodiment, the direct crosslinking process comprises forming a reaction mixture by adding Cl—F, at a temperature in the range of room temperature to 100° C., to an evacuated vessel containing a cyano-functionalized polymer comprising a backbone chain comprising repeat units of tetrafluoroethylene, perfluoromethylvinyl ether, and a molar concentration in the range of 0.5 to 5 mol-% of repeat units represented by Structure VI

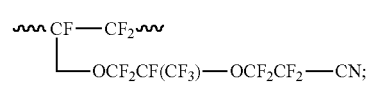

wherein said cyano-functionalized polymer has no crystalline melting point above 180° C. that is associated with a latent heat of melting greater than 1 J/g; subjecting said reaction mixture to heating to a temperature in the range of 250 to 300° C.; removing residual Cl—F following the step of heating to 250 to 300° C., followed by further heating the polymer to a temperature in the range of >300 to 350° C. in an inert atmosphere.

In still another aspect, the present invention provides an imageable article comprising a substrate having a surface, and an imageable film disposed upon said substrate, said imageable film comprising one or more dichloroamino-functionalized polymers having a backbone chain comprising fluoroalkylene repeat units optionally substituted by ether oxygen, and a molar concentration in the range of a molar concentration of 0.5 to 50 mol-% of repeat units represented by Structure I

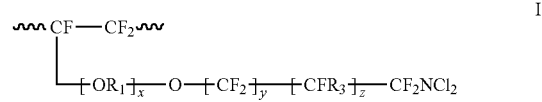

where x is an integer in the range of 0 to 3, y is an integer in the range of 0 to 6, and z is an integer in the range of 0 to 3; $R_1=(CF_2)_aCFR_2$, where a is an integer in the range of 0 to 6, and $R_2$ is F or $C_{1-6}$ perfluoroalkyl optionally substituted by ether oxygen; $R_3$ is F or $C_{1-6}$ perfluoroalkyl optionally substituted by ether oxygen; with the proviso that y and z cannot both be zero; and, with the further proviso that no repeat unit in the backbone chain of said dichloroamino-functionalized polymer has more than two vinyl hydrogens attached thereto; and, wherein said dichloroamino-functionalized polymer has no crystalline melting point above 180° C. that is associated with a latent heat of melting greater than 1 J/g.

The imageable film is conveniently deposited upon the surface of the substrate by solution or melt coating. One preferred method of deposition is by spin-coating a solution onto a substrate followed by evaporative extraction of the solvent to prepare a film of a thickness in the range of 0.2 to 3 micrometer, preferably 0.5 to 1 micrometer.

In one embodiment of the imageable article, in the dichloroamino-functionalized polymer, x=1, y=1, z=1, a=1, $R_2$=CF$_3$; and $R_3$=F.

In one embodiment of the imageable article, in the dichloroamino-functionalized polymer, the molar concentration of repeat units represented by Structure I is in the range of 0.5 to 5 mol-%. In a further embodiment of the imageable article, in the dichloroamino-functionalized polymer, the molar concentration of repeat units represented by Structure I is in the range of 3 to 5 mol-%.

In one embodiment of the imageable article, the dichloroamino-functionalized polymer further comprises repeat units of perfluoroalkyl vinyl ether (PAVE). In a further embodiment of the imageable article, in the dichloroamino-functionalized polymer, the PAVE is perfluoromethyl vinyl ether (PMVE), perfluoroethyl vinyl ether (PEVE), perfluoropropyl vinyl ether (PPVE), perfluorobutyl vinyl ether (PBVE), or a combination of two or more thereof.

In one embodiment of the imageable article, in the dichloroamino-functionalized polymer at least a portion of the fluoroalkylene repeat units are branched fluoroalkylene repeat units. Suitable fluoroalkylene repeat units include but are not limited to those derived from tetrafluoroethylene (TFE), hexafluoropropylene (HFP), vinylidene fluoride (VF$_2$), and perfluorodimethyldioxole (PDD). Particularly suitable are combinations of fluoroalkylene repeat units such as such as HFP with VF$_2$, and TFE with PDD.

Suitable dichloroamino-functionalized polymers of which many embodiments are solvent soluble, melt processable, or both, include but are not limited to:

TFE/PAVE/8-CF$_2$NCl$_2$VE copolymers wherein the PAVE repeat unit is PMVE, PEVE, PPVE, PBVE, or a combination of two or more thereof, wherein the repeat unit derived from the PAVE is present at a concentration in the range of 18-49 mol %.

PDD/TFE/8-CF$_2$NCl$_2$VE and PDD/8-CF$_2$NCl$_2$VE copolymers wherein the PDD repeat unit is present in the backbone at a concentration in the range of 30 to 99 mol-%.

HFP/VF$_2$/8-CF$_2$NCl$_2$VE copolymers wherein the HFP repeat unit is present in the backbone at a concentration in the range of 15 to 50 mol-%.

HFP/TFE/8-CF$_2$NCl$_2$VE copolymers wherein the HFP repeat unit is present in the backbone at a concentration in the range of 25 to 35 mol-%.

In one embodiment of the imageable article, the dichloroamino-functionalized polymer has no melting point above 150° C. that is associated with a latent heat of melting greater than 1 J/g.

Substrates suitable for use in the imageable article include metal, glass, and inorganic substrates particularly those of interest to electronic, semiconductor, and optical applications such as silicon, gallium arsenide, aluminum gallium arsenide, indium phosphide, gold, copper, aluminum, potassium titanyl phosphonate, lithium niobate, sapphire, silica, and titanium dioxide. A preferred substrate is silicon. Applications in photolithography, photovoltaics. electrowetting and microlens arrays, are contemplated for the imageable article.

In one embodiment, the imageable article comprises a silicon substrate having a surface, and an imageable film of a thickness in the range of 0.5 to 1.5 micrometers thick disposed upon said surface, said imageable film comprising a solvent soluble dichloroamino-functionalized polymer comprising repeat units of tetrafluoroethylene, a molar concentration in the range of 40 to 45 mol-% of perfluorodimethyldioxole repeat units, and a molar concentration in the range of 3 to 5 mol-% of repeat units represented by Structure V

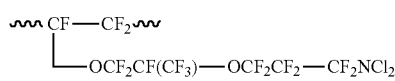

V wherein said dichloroamino-functionalized polymer has no crystalline melting point above 150° C. that is associated with a latent heat of melting greater than 1 J/g, with the proviso that said dichloroamino-functionalized polymer is soluble in a fluorinated solvent.

In a further aspect the invention provides a method comprising imagewise exposing an imageable article to ultraviolet light at least a portion of which lies in the wavelength range from 200 to 425 nanometers; and, subjecting the thus imagewise exposed imageable article to image development, thereby producing an imaged article; wherein said imageable article comprises a substrate having a surface, and an imageable film disposed upon said substrate, said imageable film comprising one or more dichloroamino-functionalized polymers having a backbone chain comprising fluoroalkylene repeat units optionally substituted by ether oxygen, and a molar concentration in the range of a molar concentration of 0.5 to 50 mol-% of repeat units represented by Structure I

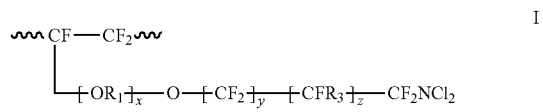

I where x is an integer in the range of 0 to 3, y is an integer in the range of 0 to 6, and z is an integer in the range of 0 to 3; $R_1=(CF_2)_aCFR_2$, where a is an integer in the range of 0 to 6, and $R_2$ is F or $C_{1-6}$ perfluoroalkyl optionally substituted by ether oxygen; $R_3$ is F or $C_{1-6}$ perfluoroalkyl optionally substituted by ether oxygen; with the proviso that y and z cannot both be zero; and, with the further proviso that no repeat unit in the backbone chain of said dichloroamino-functionalized polymer has more than two vinyl hydrogens attached thereto; and, wherein said dichloroamino-functionalized polymer has no crystalline melting point above 180° C. that is associated with a latent heat of melting greater than 1 J/g.

An imageable article suitable for the imagewise exposure method of the present invention can act as a negative photoresist when imagewise exposed using UV light in the wavelength region from 200 to 425 nm, preferably 250 to 370 nm. As has been discussed supra and demonstrated in the specific embodiments infra, exposure of the dichloroamino-functionalized polymer cause it to undergo crosslinking to form the azo-crosslinked polymer. When a suitable imageable article is imagewise exposed to UV, the area of the imageable surface of a suitable imageable article that is exposed to the UV light will undergo crosslinking, while that area of the imageable surface that is masked from the UV light will remain uncrosslinked. After imagewise exposure, the imageable article can be subject to development by exposing the imaged surface to a fluorinated solvent such as perfluoro-N-methylmorpholine, available as PF-5052 performance fluid from the 3M company. The unexposed portion of a suitable imageable film will dissolve in the solvent while the exposed portion will remain intact, thereby creating a negative image of the masking pattern employed in the imagewise exposure. If needed, all or a portion of the image in its azo form as represented by Structure III can be converted to the fluoroalkenyl-crosslinked represented by Structure IV by heating to 200 to 350° C.

The thus prepared imaged article can then be employed in the applications known in the art for imaged polymeric articles. These include photolithography and photovoltaics.

Substrates suitable for use in the imagewise exposure method disclosed herein include metal, glass, and inorganic substrates particularly those of interest to electronic, semiconductor, and optical applications such as silicon, gallium arsenide, aluminum gallium arsenide, indium phosphide, gold, copper, aluminum, potassium titanyl phosphonate, lithium niobate, sapphire, silica, and titanium dioxide. A preferred substrate is silicon.

In one embodiment of the imagewise exposure method hereof, a suitable imageable film is characterized by a thickness in the range of 0.2 to 3 micrometers, preferably 0.5 to 1 micrometer.

While not demonstrated it is anticipated that films thicker than 0.2 to 0.3 micrometers could be imaged as well since UV light was shown to fully penetrate and crosslink a polymer film 0.06 inch (1500 microns thick) in Example 12. In one embodiment of the imagewise exposure method hereof, in the dichloroamino-functionalized polymer of a suitable imageable film, x=1, y=1, z=1, a=1, $R_2$=$CF_3$; and $R_3$=F.

In one embodiment of the imagewise exposure method hereof, in the dichloroamino-functionalized polymer of the imageable film, the molar concentration of repeat units represented by Structure I is in the range of 0.5-5 mol-%. In a further embodiment of the imagewise exposure method hereof, in the dichloroamino-functionalized polymer of a suitable imageable film, the molar concentration of repeat units represented by Structure I is in the range of 3-5 mol-%.

In another aspect, the present invention provides an imaged article comprising a substrate having a surface, and a crosslinked coating imagewise disposed upon said surface, said crosslinked coating comprising an azo-crosslinked polymer represented by Structure III In one embodiment, in the azo-crosslinked polymer of the imaged article, $\Pi_\alpha$ and $\Pi_\beta$ are the same and each further comprises PAVE repeat units. In a further embodiment, PAVE ether is PMVE, PEVE, PPVE, PBVE, or a combination of two or more thereof.

In one embodiment, in the azo-crosslinked polymer of the imaged article hereof, at least a portion of the fluoroalkylene repeat units are branched fluoroalkylene repeat units. Suitable fluoroalkylene repeat units include but are not limited to those derived from tetrafluoroethylene (TFE), hexafluoropropylene (HFP), vinylidene fluoride ($VF_2$), and perfluorodimethyldioxole (PDD). Particularly suitable are combinations of fluoroalkylene repeat units such as such as HFP with $VF_2$, and TFE with PDD.

In a preferred embodiment of the imaged article hereof, the azo-crosslinked polymer represented by Structure III further comprises repeat units of TFE and PAVE wherein the repeat unit derived from the PAVE is present at a concentration in the range of 18-49 mol %. The PAVE repeat unit is PMVE, PEVE, PPVE, PBVE, or a combination of two or more thereof.

III

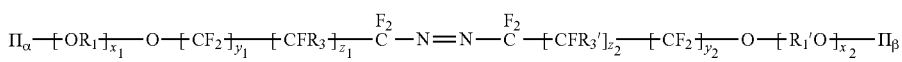

wherein each of $\Pi_\alpha$ and $\Pi_\beta$ is a polymeric radical having a backbone chain comprising fluoroalkylene repeat units optionally substituted by ether oxygen, and azo-crosslinked repeat units at a molar concentration in the range of a molar concentration of 0.5 to 50 mol-%; where $x_1$ and $x_2$ each independently is an integer in the range of 0 to 3; $y_1$ and $y_2$ each independently is an integer in the range of 0 to 6, and $z_1$ and $z_2$ each independently is an integer in the range of 0 to 3; $R_1$=$(CF_2)_a CFR_2$, where a is an integer in the range of 0 to 6, and $R_2$ is F or $C_{1-6}$ perfluoroalkyl optionally substituted by ether oxygen; $R_1'$=$(CF_2)_{a'}CFR_2'$ where a' is an integer in the range of 0 to 6, and $R_2'$ is F or $C_{1-6}$ perfluoroalkyl optionally substituted by ether oxygen; and, $R_3$ and $R_3'$ are each independently F or $C_{1-6}$ perfluoroalkyl optionally substituted by ether oxygen; with the proviso that $y_1$ and $z_1$ cannot both be zero; with the further proviso that $y_2$ and $z_2$ cannot both be zero; with the further proviso that no repeat unit in the backbone chain of said $\Pi_\alpha$ and $\Pi_\beta$ polymeric radicals has more than two vinyl hydrogens attached thereto; and, with the further proviso that $\Pi_\alpha$ and $\Pi_\beta$ can be the same or different.

In one embodiment, in the azo-crosslinked polymer of the imaged article hereof, $\Pi_\alpha$ and $\Pi_\beta$ are the same.

In an alternative embodiment, in the azo-crosslinked polymer of the imaged article hereof, $\Pi_\alpha$ and $\Pi_\beta$ are different.

In an alternative preferred embodiment of the imaged article hereof, the azo-crosslinked polymer represented by Structure III further comprises repeat units of PDD and, optionally, TFE wherein the PDD repeat unit is present in the backbone at a concentration in the range of 30 to 99 mol-%.

In an alternative preferred embodiment of the imaged article hereof, the azo-crosslinked polymer represented by Structure III further comprises repeat units of HFP and $VF_2$ wherein the HFP repeat unit is present in the backbone at a concentration in the range of 15 to 50 mol-%.

In an alternative preferred embodiment of the imaged article hereof, the azo-crosslinked polymer represented by Structure III further comprises repeat units of HFP and TFE wherein the HFP repeat unit is present in the backbone at a concentration in the range of 25 to 35 mol-%.

In one embodiment, the imaged article comprises a silicon substrate having a surface, and a crosslinked coating imagewise disposed upon said surface, said crosslinked coating, of a thickness in the range of 0.5 to 1.5 micrometers, comprising an azo-crosslinked polymer represented by Structure VII

VII

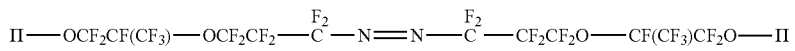

In one embodiment, in the azo-crosslinked polymer of the imaged article hereof, $\Pi_\alpha$ and $\Pi_\beta$ are the same, x=1, y=1, z=1, and a=1; $R_2$ and $R_2'$=$CF_3$; and $R_3$ and $R_3'$=F.

In one embodiment, in the azo-crosslinked polymer of the imaged article hereof, the molar concentration of crosslinked repeat units as represented in Structure III is in the range of 0.5 to 5 mol-%. In a further embodiment, in the azo-crosslinked polymer of the imaged article hereof, the molar concentration of crosslinked repeat units as represented in Structure III is in the range of 3 to 5 mol-%.

wherein π is a polymeric radical having a backbone chain comprising repeat units of tetrafluoroethylene, a molar concentration in the range of 40 to 45 mol-% of perfluorodimethyldioxole repeat units, and a molar concentration in the range of 3 to 5 mol-% of repeat units represented by Structure VII.

In one embodiment, the imaged article is in the form of a printed circuit board. In an alternative embodiment, the imaged article is in the form of a surface for electrowetting.

The invention is further described, but not limited by the following specific embodiments.

EXAMPLES

Terminology and Materials

| Glossary | |
|---|---|
| AFM | Atomic Force Microscopy, performed using a Bruker Dimension 3100 instrument with a Nanoscope IV controller. |
| ATR | Attenuated Total Reflectance spectroscopy in the infrared (IR) performed using a Thermo Nicolet 6700 FT-IR equipped with a SensIR Durascope ™ |
| IR | Infrared spectroscopy |
| IV | Inherent viscosity |
| MDR | Moving Die Rheometer, Monsanto MDR 2000 |
| UV | Ultraviolet Radiation |
| $T_g$ | Glass-transition temperature as determined using differential scanning calorimetry. (DSC) |

Azo and fluoroalkenyl crosslinks made by joining two cyano groups were counted as two units in the final crosslinked polymers. This is of great convenience when relating the mole % of cyano groups in a starting P—CN to the mole % of —N═N— and —CF2CF2- crosslinks in the final P—N═N—P or P—CF2CF2-P polymers.

Sample Preparation

Film samples were prepared using a laboratory hydraulic press. A specified weight of polymer was placed into a layered structure consisting of steel sheet/Kapton® polyimide film/polymer sample/Kapton® polyimide film/steel sheet. The so-prepared layered structure was then placed between the platens of a Pasadena Hydraulics, Inc press. Unless stated otherwise, polymer was piled on the Kapton® and then pressed down giving a roughly circular piece generally 1 to 5" in diameter and tens of mils thick. When it was desired to press a second film from the same polymer sample that had been pressed into a previously prepared pressed film, the previously pressed film was first cut up into pieces and the pieces then pressed again, as described.

When molded specimens in the range of 0.060 to 0.160 inches thick were fabricated, the layered structure consisted of steel sheet/Kapton® polyimide film/a pile of polymer centered in a rectangular mold/Kapton® polyimide film/steel sheet, the mold consisting of a stainless steel sheet with a rectangular hole cut in the center. Extra polymer (flashing) was trimmed from the edges of the molded parts.

The pressing conditions are expressed herein the following manner: time (min)/temperature (° C.)/ram force (lbs). The "time" refers to the dwell time of the polymer sample at the "temperature" indicated, and at the exerted ram force indicated. Thus the expression 3 min/95° C./0 lbs means that the sample was held for 3 min. with the platens set at 95° C. and with the platens closed but exerting 0 lbs of force.

| Materials Used in Examples | | |
|---|---|---|
| Cl—F | chlorine monofluoride, | Obtained from Advance Research Chemicals or synthesized, as indicated, infra. |
| 8-CNVE | $CF_2$═$CFOCF_2CF(CF_3)OCF_2CF_2CN$ | Synthesized according to the method taught in European Patent Application 729940, Sep. 4, 1996. |
| i-8CNVE | $CF_2$═$CFOCF_2CF_2CF_2OCF(CF_3)CN$ | Prepared as taught in European Patent Application 710645 May 8, 1996. |
| FC-40 | Fluorinert ®FC-40 | 3M Company |
| HFP | hexafluoropropylene, $CF_3CF_2$═$CF_2$ | Obtained from DuPont |
| HFPO Dimer Peroxide | $CF_3CF_2CF_2OCF(CF_3)(C$═$O)OO(C$═$O)CF(CF_3)OCF_2CF_2CF_3$ | Prepared according to the teachings of U.S. Pat. No. 5,831,131 |
| PF-5052 | perfluoro-N-methylmorpholine | 3M Company |
| PDD | 2,2-bis(trifluoromethyl)-4,5-difluoro-1,3-dioxole, | Prepared according to the teachings of U.S. Pat. No. 4,409,393. |
| PMVE | Perfluoromethylvinylether, $CF_3OCF$═$CF_2$ | Obtained from DuPont |
| TFE | Tetrafluoroethylene, $CF_2$═$CF_2$ | Obtained from DuPont |
| Vertrel® XF | $CF_3CFHCFHCF_2CF_3$ | Obtained from DuPont |
| $VF_2$ | vinylidene fluoride, $CH_2$═$CF_2$ | Obtained from Solvay Solexis Inc. |
| Krytox 157 FSL | Perfluoropolyether surfactant having carboxylate end groups. | Obtained from DuPont |

Analysis
Spectroscopy

The chemistry that takes place in the processes disclosed herein occurs at the terminal functional group of the 8-CNVE monomer unit, as described infra. The 8-CNVE can be tracked in the IR by an ether peak at 1036 cm$^{-1}$. The monomer unit derived from PMVE is characterized by an IR absorption peak at 889 cm$^{-1}$. There is no evidence that any of the chemistry described herein involved monomer units derived from PMVE. That is, the monomer groups are believed to be inert. The ratio of the peak intensities at 1036 cm$^{-1}$ and 899 cm$^{-1}$ was then taken as a means for measuring the extent of reaction of the CN functional group.

The IR spectrum was determined using a Thermo Nicolet 6700 FT-IR equipped with a SensIR Durascope™. The Durasope™ was a single bounce Diamond Attenuated Total Reflectance (DATR) accessory. A background spectrum of the DATR was acquired before each sample. The DATR was wiped clean after each sample. The sample was placed in contact with the diamond. The sample was then pressed against the diamond using the sample press. The spectrum was collected and compared to the background. A baseline and ATR correction were applied to the spectrum using Nicolet Omnic® software. The spectrum was imported to G/Al 8.0 Spectroscopy software. In G, a Fourier deconvolution algorithm was applied using a gamma of 6. The peaks of interest were integrated within G. The peak height and areas were determined.

After treatment with Cl—F, any given specimen was purged using N$_2$ to remove any residual Cl—F or Cl$_2$. Purging was accomplished by transferring the Cl—F-treated specimen from the autoclave to a ziplock plastic bag or a glass bottle, the bag or bottle was sealed, and placed in a fume hood. With the specimen in the fume hood, a small opening was made in the bag or bottle, and a tube carrying nitrogen was placed therein. The nitrogen purge was continued for at least several hours.

Polymer Compositional Designations

Throughout the Examples, polymers are referred to variously as P—CF$_2$NCl$_2$, P—CF$_2$N═NCF$_2$—P, and P—CF$_2$CF$_2$—P, as well as mixtures thereof. In every instance, the given designation is intended to indicate the species that predominantly affects the measured properties, mechanical, thermal, thermomechanical, and spectroscopic. That is, for example, as shown infra, P—CF$_2$NCl$_2$ converts to P—CF$_2$CF$_2$—P via mixtures of P—CF$_2$NCl$_2$, P—CF$_2$N═NCF$_2$—P and P—CF$_2$CF$_2$—P and a process may stop at a mixture stage. Thus a designation such as P—CF$_2$NCl$_2$ is not intended to suggest that the indicated species is present in neat form. In many of the examples, it is strongly believed that some other species than that indicated is present at undetermined concentration.

Inherent Viscosity

Inherent Viscosity (IV) was determined using a solution of 0.1 g of polymer in 100 g of FLUTEC™ PP11 perfluorocarbon fluid (F2 Chemicals Ltd., Preston, UK) at 30° C., except where otherwise noted.

Example 1

Progression of Cl—F Chemistry and Crosslinking with Time and Temperature

A. Polymer Synthesis:

A perfluoroelastomer containing copolymerized monomers of TFE, PMVE, and 8CNVE was prepared as follows. Three aqueous streams were each fed continuously to a 2 liter, mechanically stirred, water jacketed, stainless steel autoclave at a rate of 162 cc/hr. The first stream consisted of a solution of 12.8 g ammonium persulfate in 5 kg of deionized, deaerated water. The second stream consisted of 249.5 g of F(CF$_2$)$_5$—CH$_2$O—PO$_2$(OH)(NH$_4$) surfactant and 41.6 g of Krytox® 157FSL surfactant in 5 kg of deionized, deaerated water. The third stream consisted of a solution of 77.0 g disodium hydrogen phosphate heptahydrate in 5 kg of deionized, deaerated water. Using a diaphragm compressor, a mixture of TFE (145.5 g per hour (g/hr)) and PMVE (83.6 g/hr) was fed at a constant rate. Using a syringe pump, 8-CNVE was fed to the reactor at a rate of 4.20 milliliters per hour. The temperature was maintained at 85° C., and a pressure at 4.1 MPa (600 psig) was maintained throughout the reaction. The polymer emulsion was removed continuously by means of a letdown valve and the unreacted monomers were vented. Eight liters of deionized water was added per liter of emulsion and then 1% NaOH solution added until its pH was 6.9. After pH adjustment, the emulsion was coagulated with magnesium sulfate heptahydrate and washed with deionized water. The polymer was dried at 70° C. for 48 hours. The polymer had an inherent viscosity of 0.48 measured in a solution of 0.1 g polymer in 100 g FLUTEC™ PP11 perfluorocarbon fluid (F2 Chemicals Ltd., Preston, UK) at 30° C.

T$_g$ was determined to be 9.5° C. by DSC. No melting endotherm was observed.

Composition was found to be 57.61 wt ° A) TFE, 35.60 wt ° A) PMVE, and 6.79 wt % 8-CNVE [71.3 mole ° A) TFE, 26.5 mole ° A) PMVE, 2.2 mole ° A) 8-CNVE] by FTIR. This polymer will be referred to herein as P1-CN.

B. Film 5 g of the P1-CN polymer prepared in Example 1A were placed between the platens of a hydraulic press as described, supra, and processed as follows: 3 min/95° C./0 lbs followed by 3 min/95° C./5,000 lbs, followed by release of pressure and cooling. The resulting film was roughly circular with a ca. 6.4 cm diameter. Thickness ranged from 0.003 to 0.0046 inches.

An ATR spectrum taken of the P1-CN film found the area of the 1036 cm$^{-1}$ band corresponding to copolymerized 8-CNVE to be 1.11 times the area of the 889 cm$^{-1}$ band corresponding to copolymerized PMVE. The intensity ratio of the 1036 cm$^{-1}$ band relative to the 889 cm$^{-1}$ band was observed to decrease as the reaction of Cl—F with the —CN group in copolymerized 8-CNVE progressed.

A thin strip weighing 0.0878 g was cut from the thus prepared film. This strip was placed into a vial with 2 g of PF-5052 liquid. The vial was sealed and subject to rolling on a roll mill at 120 rpm for about 41 hours until no further dissolution was apparent by visual inspection. After rolling, the contents of the vial were visually examined. The film appeared to have partially dissolved, leaving a residue of numerous gel particles suspended in the solution.

Three small 1.5" long dog-bone-shaped strips of the film were pulled at 23° C. at 0.5 inch/minute with the sample gauge length of 0.86 inches using an Instron® Universal Testing Machine. Tensile strength was an average 640 psi at 300% elongation to break.

Additional samples of the P1-CN polymer prepared in Example 1A were prepared for use in Part C, below. Each 5 g sample was hot pressed for 3 min/95° C./0 lbs followed by 3 min/95° C./5,000 lbs, followed by release of pressure and cooling. The films so prepared were roughly circular, ~2.5" in diameter and varied from about 0.0030 to 0.0046" inches in thickness.

C. Reaction with Cl—F

Example 1a

Treatment with Cl—F for 7 Hours at 70° C.

A 400 ml Hastelloy® autoclave was loaded with 5.6 g $Cl_2$ (0.08 mole) and 6.1 g of 25 mole % $F_2$ (0.05 mole $F_2$) in $N_2$. This mixture was heated to 250° C. over a period of ~1.5 hours and then held at 250° C. for 1 hour. No exotherm was observed. The product was believed to be an approximately 1:3 $Cl_2$:Cl—F mixture.

Gambaretto et al., J. Fluorine Chem. 7, 569 (1976) showed near quantitative yield of Cl—F when $F_2$ plus a slight excess of $Cl_2$ were passed through a 250° C. tube furnace with a 100 second contact time.

One of the approximately 2.5" diameter film specimens of the P1-CN film prepared in Example 1-B was hand-pressed down on a Teflon® film so that the specimen exhibited enough adhesion to hold the film specimen in place as it was being lowered into a horizontal position into a 400 ml Hastelloy® autoclave. The autoclave was sealed, evacuated, and then pressured to 40 psig with the $Cl_2$/Cl—F mixture prepared supra.

The autoclave was heated for 7 hours at 70° C. After cooling the autoclave, the polymer film was recovered, transferred to a tight container, the container moved to a fume hood, the container opened, tubing inserted in the open mouth of the container, and a slow flow of purging nitrogen run through the container for 21 hours to remove any residual $Cl_2$ or Cl—F. The thus treated film is herein designated P1-$CF_2NCl_2$-1a.

An ATR spectrum was taken of the side of the P1-$CF_2NCl_2$-1a film away from the Teflon® sheet. The 1036 $cm^{-1}$ band had decreased to 0.20× the area of the 889 $cm^{-1}$ peak. A new absorption band at 960 $cm^{-1}$ was also observed, with an area 0.23× the area of the 889 $cm^{-1}$ peak. Since Hynes et. al., op.cit., reported a strong band at 968 $cm^{-1}$ in the gas phase IR of $CF_3CF_2CF_2NCl_2$, the new band observed herein at 960 $cm^{-1}$ can be assigned to the P1-CN polymer wherein the CN groups have been converted to $CF_2NCl_2$ groups by the Cl—F.

A 0.0737 g strip of the thus prepared film of P1-$CF_2NCl_2$-1a was rolled, as in Example 1 B, with 2 g of PF-5052 solvent until there was no longer any visual change By visual examination, it was observed that the result was a hazy solution having fewer gel particles than observed for the solution of P1-CN, described supra, but still too many to count.

Two small dog-bone-shaped strips of the P1-$CF_2NCl_2$-1a film were pulled on an Instron Machine, as described supra, exhibiting an average tensile strength of 370 psi at 330% elongation to break.

Example 1b

Treatment with Cl—F for 7 Hours at 90° C.

The materials and procedures employed in Example 1a were repeated except that the temperature of the autoclave was 90° C. The polymer film so prepared is herein designated P1-$CF_2NCl_2$-1b An ATR spectrum was taken of the P1-$CF_2NCl_2$-1b film. The intensity ratio of the 1036 $cm^{-1}$ absorption to the 889 $cm^{-1}$ absorption was 0.2243. The intensity ratio of the 960 $cm^{-1}$ absorption to that of the 889 $cm^{-1}$ absorption was 0.1265.

A 0.1247 g strip of the P1-$CF_2NCl_2$-1b film was rolled with PF-5052, as in Example 1a. The resultant mixture was observed to consist of a mass of soft gel. The thus treated strip of P1-$CF_2NCl_2$-1b film was observed to have swollen to many times its original size, but still had a faint resemblance to the starting piece of film. When, however, an attempt was made to pick up the swollen P1-$CF_2NCl_2$-1b film with tweezers, the tines passed right through without hitting anything solid enough to be picked up.

A 1 gram sample of the P1-$CF_2NCl_2$-1b film was cut up and pressed between the platens of the hydraulic press, as described supra, in the following manner: 3 min/95° C./0 lbs then 3 min/95° C./5,000 lbs, followed by release of pressure and cooling. The resulting film was homogeneous in appearance, flat, and approximately circular with a diameter of 44 mm. The thus prepared P1-$CF_2NCl_2$-1b film was not noticeably different in film formability from the P1-$CF_2NCl_2$ polymer used to prepare the P1-$CF_2NCl_2$-1a film.

Example 1c

Treatment with Cl—F for 7 Hours at 100° C.

The procedures and materials employed in Example 1a were repeated except that the autoclave temperature was 100° C. The film so treated is herein designated P1-$CF_2NCl_2$/Azo-1c to indicate that the properties thereof suggest that some amount of crosslinking occurred during the heating.

An ATR spectrum was taken of the P1-$CF_2NCl_2$/Azo-1c film. The intensity ratio of the 1036 $cm^{-1}$ absorption to the 889 $cm^{-1}$ absorption was 0.1877. The intensity ratio of the 960 $cm^{-1}$ absorption to that of the 889 $cm^{-1}$ absorption was 0.1398.

A 0.1175 g strip of the P1-$CF_2NCl_2$/Azo-1c film was rolled with PF-5052, as in Example 1a. The resultant mixture was observed to consist of a mass of gel indistinguishable from the similarly treated P1-$CF_2NCl_2$-1b film.

A 1 gram sample of the P1-$CF_2NCl_2$/Azo-1c film was cut up and pressed in the hydraulic press, as described supra, in the following manner: 3 min/95° C./0 lbs then 3 min/95° C./5,000 lbs, followed by release of pressure and cooling. The resulting film was a flat and approximately circular with an approximately 44 mm diameter. Some roughness, lines and holes in the pressed film were observed.

Example 1d

Treatment with Cl—F for 7 Hours at 130° C.

The materials and procedures of Example 1a were repeated except that the autoclave temperature was 130° C. The film so prepared is herein designated polymer P1-$CF_2NCl_2$/Azo-1d.

An ATR spectrum was taken of the P1-$CF_2NCl_2$/Azo-1d film. The intensity ratio of the 1036 $cm^{-1}$ absorption to the 889 $cm^{-1}$ absorption was 0.03. The intensity ratio of the 960 $cm^{-1}$ absorption to that of the 889 $cm^{-1}$ absorption was 0.19.

A 0.1802 g strip of the P1-$CF_2NCl_2$/Azo-1d film was rolled with PF-5052, as in Example 1a. The film specimen was observed to have retained its integrity, and had absorbed 0.6239 g of the solvent, for a 440% increase in weight.

A 1 g sample of the P1-$CF_2NCl_2$/Azo-1d film was cut up and pressed in the hydraulic press, as described supra, in the following manner: 3 min/95° C./0 lbs then 3 min/95° C./5,000 lbs, followed by release of pressure and cooling. The resulting film exhibited rough texture, lines, and holes.

Example 1e

Treatment with Cl—F for 7 Hours at 70° C. and then 2 Hours 150° C.

The materials and procedures of Example 1a were repeated except that the autoclave temperature was first held for 7 hours at 70° C., and raised to 150° C. and held for 2 hours. The film so prepared is herein designated polymer P1-$CF_2NCl_2$/Azo-P1-1e.

An ATR spectrum was taken of the P1-$CF_2NCl_2$/Azo-P1-1e film. The intensity ratio of the 1036 $cm^{-1}$ absorption to the 889 $cm^{-1}$ absorption was 0.07. The intensity ratio of the 960 $cm^{-1}$ absorption to that of the 889 $cm^{-1}$ absorption was 0.10.

A 0.0345 g strip of the P1-$CF_2NCl_2$/Azo-P1-1e film was rolled with PF-5052, as in Example 1a. The film specimen was observed to have retained its integrity, and had absorbed 0.1637 g of the solvent, for a 370% increase in weight.

Two small dog-bone-shaped strips cut from this film were pulled on an Instron as described supra. Average tensile strength was 1000 psi at 320% elongation to break.

Example 1f

Treatment with Cl—F for 7 Hours at 70° C., 2 Hours 150° C., and 2 Hours at 200° C. Additional Heating Under $N_2$ at 300 and 350° C.

The materials and procedures of Example 1a were repeated except that the autoclave was first heated for 7 hours at 70° C., then the temperature was raised to 150° C., and held for an additional 2 hours. The temperature was then raised to 200° C., and held for an additional 2 hours. The film so prepared is herein designated polymer P1-Azo-P1/P1-$CF_2CF_2$—P1-1f.

An ATR spectrum was taken of the P1-Azo-P1/P1-$CF_2CF_2$—P1-1f film. The intensity ratio of the 1036 $cm^{-1}$ absorption to the 889 $cm^{-1}$ absorption was 0.00. The intensity ratio of the 960 $cm^{-1}$ absorption to that of the 899 $cm^{-1}$ absorption was 0.00. A new absorption peak at 970 $cm^{-1}$ was observed. The intensity of the 970 $cm^{-1}$ absorption to that at 889 $cm^{-1}$ was 0.08.

A 0.0358 g strip of the P1-Azo-P1/P1-$CF_2CF_2$—P1-1f film was rolled with PF5052, as in Example 1a. The film specimen was observed to have retained its integrity, and had absorbed 0.0822 g of the solvent, for a 130% increase in weight. There was minimal change in the appearance of the strip.

Two small dog-bone-shaped strips of the P1-Azo-P1/P1-$CF_2CF_2$—P1-1f film were pulled on an Instron, described supra. Average tensile strength was 1300 psi at 80% elongation to break.

A 0.2573 g strip of the P1-Azo-P1/P1-$CF_2CF_2$—P1-1f film was further heated for 2 hours under nitrogen at 300° C. reducing its weight to 0.2474 g. The thus treated film is herein designated P1-$CF_2CF_2$—P1-1f. An ATR spectrum of the thus treated film strip showed that the 970 $cm^{-1}$/889 $cm^{-1}$ absorption strength ratio was 0.30. Rolling a 0.0933 g piece of the P1-$CF_2CF_2$—P1-1f film with 1.5 g of PF-5052 caused it to increase in weight to 0.2503 g (168% wt gain).

An additional 0.2480 g strip of P1-Azo-P1/P1-$CF_2CF_2$—P1-1f film was further heated for 2 hours under nitrogen at 350° C. causing its weight to decrease to 0.2419 g. An ATR spectrum of the thus treated film strip showed that the 970 $cm^{-1}$:899 $cm^{-1}$ absorption strength ratio was 0.30. Rolling an 0.0706 g piece of this film with 1.5 g of PF-5052 caused it to increase in weight to 0.2132 g (201% weight gain).

Example 2

Photochemical Conversion to Azo Crosslink Followed by Thermal Conversion to —$CF_2CF_2$— Crosslink A 5 g film sample of the P1-CN polymer was treated as in Example 1a. The film so prepared will be designated herein P1-$CF_2NCl_2$-2.

An ATR spectrum showed the 1036 $cm^{-1}$:889 $cm^{-1}$ absorption strength ratio to be 0.32, and the 960 $cm^{-1}$:899 $cm^{-1}$ absorption strength ratio to be 0.09.

A small section of the P1-$CF_2NCl_2$-2 film was cut off with scissors and placed in a quartz box 3.8" square by 1.3" high, under a slow, steady $N_2$ purge. A Rayonet UV bulb, catalog R.P.R 2537A, was brought up to the quartz box, bringing the bulb within about an inch and a half of the P1-$CF_2NCl_2$-2 film, a distance at which the UV bulb delivered about 0.17 milliwatts/$cm^2$. The film, to be herein designated as P1-Azo-P1-2, was recovered after 24 hrs of UV exposure. An ATR spectrum of the P1-Azo-P1-2 film showed the 1036 $cm^{-1}$:889 $cm^{-1}$ absorption strength ratio to be 0.31. The 960 $cm^{-1}$ absorption band was not detectable; and, the 970 $cm^{-1}$ band was not observed.

The thus prepared P1-Azo-P1-2 film was divided into a 0.2180 g piece and a 0.1725 g piece. Rolling the 0.2180 g piece with 2 g of PF-5052 solvent caused its weight to increase to 0.4220 g (a 94% weight gain) rather than go into solution.

The 0.1725 g strip of P1-Azo-P1-2 was heated for 68 hours in a 225° C. oven under $N_2$. The film specimen so prepared is herein designated P1-Azo-P1/P1-$CF_2CF_2$—P1-2. An ATR spectrum of the P1-Azo-P1/P1-$CF_2CF_2$—P1-2 film showed the 1036 $cm^{-1}$:889 $cm^{-1}$ absorption strength ratio to be 0.26. The 960 $cm^{-1}$ absorption band was again not detectable; and, the 970 $cm^{-1}$ band characteristic of the —CF2CF2- crosslink had appeared, and the absorption strength ratio of the 970 $cm^{-1}$:889 $cm^{-1}$ absorption bands was 0.05.

The thus prepared P1-Azo-P1/P1-$CF_2CF_2$—P1-2 film was heated again, this time for 1 hour at 300° C. under $N_2$. An ATR spectrum of the thus treated film showed the 1036 $cm^{-1}$:889 cm−1 absorption strength ratio to be 0.16 and the 970 $cm^{-1}$:889 cm−1 absorption strength ratio to be 0.06. After heating, the thus prepared film weighed 0.1696 g. When rolled with 2 g PF-5052 the weight increased to 0.4010 g (a 136% weight gain).

Example 3

Reaction-Induced Changes in UV Spectrum

A disc about ¾ in. diameter by about 0.035 in. thick was cut out of the P1-$CF_2NCl_2$-1a sheet. The UV spectrum showed an absorption peak at 291 nm, close to the 294 to 298 nm absorption peaks reported by Hynes et al., op.cit., for compounds such as $CF_3CF_2CF_2NCl_2$ (294 nm) and $Cl_2NCF_2CF_2CF_2NCl_2$ (298 nm). The P1-$CF_2NCl_2$-1a film was then subject to exposure to UV irradiation according to the procedure of Example 2. The film thereby prepared, herein designated P1-Azo-P1-3 was recovered after about 94 hrs of UV exposure, and its UV spectrum was taken. The band at 291 nm had entirely disappeared. Both sides of the film showed the same UV spectrum consistent with good penetration of the light though the film and complete reaction.

A model compound represented by Structure VIII

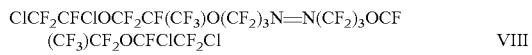

ClCF$_2$CFClOCF$_2$CF(CF$_3$)O(CF$_2$)$_3$N=N(CF$_2$)$_3$OCF(CF$_3$)CF$_2$OCFClCF$_2$Cl    VIII was prepared as follows: Neat chlorine gas was bubbled at 5-10° C. through 77.8 g of 8-CNVE. The reaction was stopped when the conversion of 8-CNVE to CF$_2$ClCFClOCF$_2$CF(CF$_3$)OCF$_2$CF$_2$CN was almost complete. The resulting material was distilled to give the desired product as a clear, colorless liquid, yield 80 g (87%), by 85° C./180 mm. $^{19}$F NMR (CDCl$_3$): −71.3 ppm (t, J=5.5 Hz, 2F), −77.5 (m, 1F), −80.2 (d, J=8.3 Hz, 3F), −82.3 to −85.8 (m, 4F), −108.8 (t, J=4.2 Hz, 2F), −145.6 (m, Br, 1F). Anal. Calc. for C$_8$Cl$_2$F$_{13}$NO$_2$: C, 20.89; Cl, 15.42; F, 53.69. Found C, 20.87; Cl, 14.50; F, 53.23. MS: [Parent-CF2CF2CN]: Calc. 332.9132. Found: 332.9166.

A 20 g sample of the thus prepared CF$_2$ClCFClOCF$_2$CF(CF$_3$)OCF$_2$CF$_2$CN was added to a monel cylinder chilled to −50° C. in dry ice/CHCl$_3$. A solution of 3 ml of BrF$_3$ dissolved in 10 ml of CF$_2$ClCCl$_2$F was added. The cylinder was closed and allowed to warm to room temperature. After two days at room temperature, the reaction mixture was poured onto 100 ml of 10% sodium hydroxide in water. The organic layer was washed with water, dried over MgSO$_4$ and evaporated down to 19.5 g of oil. This and an earlier run were combined and distilled affording,

| Cut #1 | bp 20.5° C./0.3 mm | 5.87 g |
| Cut #2 | bp 97° C./0.3 mm | 18.6 g |
| Cut #3 | pot residue | 2 g |

Fluorine NMR of Cut #2: −71.3 ppm (CF$_2$Cl), −77.3 (CFCl), −80.4 to −85.6 (CF$_2$CF(CF$_2$OCF$_2$), −108.8 (CF$_2$CF$_2$N=), 127.7 (CF$_2$N=). Anal. Calc. for C$_{16}$Cl$_4$F$_{30}$N$_2$O$_4$: C, 19.30; N, 2.81; F, 57.23; Cl, 14.24. Found C, 18.97; N, 3.58; F, 55.03; C, 13.87. GC on an Agilent, DB-5MS UI. 30 m×0.25 mm, 1 μm column, heating 10° C./min to 300° C. and then holding at 300° C. gave a major peak with a 13 minute retention time. Using a low resolution GCT Mass Spectrometer to analyze the major GC peak a M+1 peak was observed with the help of isobutane chemical ionization, the M+1 peak having a mass of 994.7 vs. 994.82059 calculated for C$_{16}$Cl$_4$F$_{30}$N$_2$O$_4$+H. Taking the mass spectrum of the same GC peak using a higher resolution LTQ Orbitrap Mass Spectrometer with chemical ionization, a M-F peak was observed at mass 974.8153 versus a mass of 974.8144 calculated for C$_{16}$O$_4$N$_2$Cl$_4$F$_{29}$.

UV spectroscopy of the model compound of Structure VIII thus prepared showed a molecular extinction coefficient of 23.13 at 379.5 nm.

Repeating UV spectroscopy on the P1-Azo-P1-3 film, but at very high gain, with baseline correction and smoothing, a new weak peak around 382 nm appeared, corresponding to the azo structure in the model compound.

Example 4

NMR Evidence for —CF$_2$CF$_2$— Crosslink

A. Preparation of 77:23 mole % Poly(TFE/8-CNVE).

A 400 ml autoclave was loaded with 150 ml deionized water, 3 g of C$_8$F$_{17}$COONH$_4$, 0.15 g Na$_2$HPO$_4$, 0.3 g ammonium persulfate, and 25 g of 8-CNVE. The autoclave was cooled, evacuated, and further loaded with 15 g TFE. Shaking the autoclave at 70° C., pressure in the autoclave peaked at 178 psig and then decreased to 9 psig 1,030 minutes later, the pressure drop indicating near complete reaction of the TFE.

The product, a hazy emulsion, was frozen on dry ice, thawed, and solids filtered off. The solids were rinsed in the filter with 2000 ml water, 500 ml methanol, and 380 ml acetone while working with a spatula to break up chunks. Sucking dry gave 28.7 g of product that gave partial solution with soft gel when mixed with PF-5052. Fluorine NMR in the melt at 320° C. found 77:23 mole % poly(TFE:8-CNVE). GPC analysis in Flutec found Mn=16,000 and Mw=41,000. The polymer so-prepared is herein designated P2-CN B. Treatment of P2-CN with Cl—F.

A 5 g sample of the P2-CN was pressed 3 min/90° C./0 lb, 3 min/90° C./5000 lb to make a film which was loaded into a 400 ml autoclave mounted on a Teflon® sheet, as described supra. The autoclave was evacuated and filled to 40 psig with the Cl$_2$/Cl—F mixture prepared in Example 1. The resulting reaction mixture was heated for 16 hrs at 70° C. affording a film product herein designated P2-CF$_2$NCl$_2$-4.

C.

A 0.0717 g slice of the P2-CF$_2$NCl$_2$-4 film was heated for 1 hour at 300° C. under N$_2$ causing its weight to decrease to 0.0646 g. The film so prepared, herein designated P2-CF$_2$CF$_2$—P2-4, was cut into two pieces.

Rolling a 0.0304 g piece of the P2-CF$_2$CF$_2$—P2-4 film with 2 g of PF-5052 increased its weight to 0.0430 g (41% weight gain).

D.

The fluorine NMR spectrum of P2-CN in the melt at 320° C. exhibited a peak at −105 ppm corresponding to the fluorine of the reactive CF$_2$CN moiety, and a peak at −139 ppm corresponding to the bolded fluorine in the unreacting CFCF$_3$. The progress of the reaction herein was followed by tracking the change in the integrated intensity of the −105 ppm versus that of the −139 ppm peak.

NMR at 160° C. of the P2-CF$_2$CF$_2$—P2-4 film exhibited a new CF2 peak appearing at −98 ppm while the −105 ppm peak exhibited a loss of integrated intensity of about 62%. The integrated intensity of the −98 ppm was approximately equal to the loss of integrated intensity exhibited by the −105 ppm peak.

Comparative Example A

Small Molecule Analog

A 1 gram sample of model compound represented by Structure VIII prepared supra, was heated in an autoclave for 1 hour at 300° C. in 50 ml of perfluorooctane, followed by cooling and extraction of residual perfluorooctane. Fluorine NMR of the thus treated model compound revealed a forest of some 50 peaks of varying sizes, and only a very small peak at −98 ppm. ATR showed no detectable peak at 970 cm$^{-1}$.

Example 5

Resistance to Aqueous Hydrolysis at 325° C.

A specimen of the P1-CN film was treated as in Example 1a except that the duration at 70° C. was 48 hours. Following treatment with Cl—F, the thus treated film was heated for 1 hour at 300° C. The resulting film is herein designated P1-CF$_2$CF$_2$—P1-5. Four specimens taken from the P1-CF$_2$CF$_2$—P1-5 film were added to 180 ml of deionized water in a Hastelloy® autoclave The autoclave was heated to 325° C. and held at temperature for 168 hours. After 168 hours, the autoclave was cooled and the specimens recovered. The thus recovered specimens were a dark, translucent brown, and elastic and strong when stretched by hand. The weight change for the four specimens is shown in Table 2.

TABLE 2

| Film Sample | Starting Weight (g) | Recovered Weight (g) | % Change in Weight |
|---|---|---|---|
| #1 | 0.5456 | 0.5438 | −0.3 |
| #2 | 0.5129 | 0.5221 | +1.8 |
| #3 | 0.6533 | 0.6782 | +3.8 |
| #4 | 0.2023 | 0.2096 | +3.6 |

Example 6

Nitrogen Loss During Crosslinking

A perfluoroelastomer containing copolymerized monomers of TFE, PMVE, and 8CNVE was prepared as follows. Three aqueous streams were each fed continuously to a 2 liter, mechanically stirred, water jacketed, stainless steel autoclave at a rate of 162 cubic centimeters per hour (cc/hr). The first stream consisted of a solution of 12.8 g ammonium persulfate in 5 kg of deionized, deaerated water. The second stream consisted of 249.5 g of $F(CF_2)_5$—$CH_2O$—$PO_2(OH)(NH_4)$ surfactant and 41.6 g of Krytox® 157FSL surfactant in 5 kg of deionized, deaerated water. The third stream consisted of a solution of 77.0 g disodium hydrogen phosphate heptahydrate in 5 kg of deionized, deaerated water. Using a diaphragm compressor, a mixture of TFE (145.5 g per hour (g/hr)) and PMVE (82.8 g/hr) was fed at a constant rate. Using a syringe pump, 8-CNVE was fed to the reactor at a rate of 5.25 milliliters per hour. The temperature was maintained at 85° C., and the pressure at 4.1 MPa (600 psig) throughout the reaction. The polymer emulsion was removed continuously by means of a letdown valve and the unreacted monomers were vented. The emulsion was collected and then diluted by adding 8 liters of deionized water per liter of emulsion. The diluted emulsion was treated with 1% $H_2SO_4$ solution until its pH was 3.0. After pH adjustment, the emulsion was coagulated with magnesium sulfate heptahydrate and washed with deionized water. The polymer was then dried at 70° C. for 48 hours. Mooney viscosity, ML-175 (1+10), was 39.6, determined according to ASTM D1646 with an L (large) type rotor at 175° C., using a preheating time of 1 minute and a rotor operation time of 10 minutes. The polymer had an inherent viscosity of 0.57. Polymer composition by NMR: 62.5 wt TFE, 34.0 wt % PMVE, 3.48 wt % 8-CNVCNE [74.5 mole % TFE, 24.4 mole % PMVE, 1.1 mole % 8-CNVE].

The polymer so prepared is herein designated P3-CN.

Nitrogen concentration in the P3-CN was determined with an Antek® NS Analyser using combustion analysis, and by NMR. The polymer was found to have 1381 ppm N by the former method, and 1246 ppm N by fluorine NMR using the —$CF_2CN$ resonance to track 8-CNVE content.

A 30 g sample of the P3-CN polymer in the form of fine crumb was added to a 400 ml Hastelloy® autoclave. The autoclave was evacuated and pressured with Cl—F (99% pure, Advance Research Chemicals, Catoosa, Okla.) to 24 psig at −10° C. The contents of the autoclave were agitated as the autoclave was heated to 70° C. over about 45 minutes and then held at 70° C. for 16 hours at an internal pressure of 40 to 39 psig. The polymer thereby prepared, herein designated P3-$CF_2NCl_2$-6, was recovered and purged with $N_2$ to get rid of residual $Cl_2$ and Cl—F. A 2 g sample of the thus prepared P3-$CF_2NCl_2$-6 polymer was hot pressed 3 min/90° C./0 lb, 3 min/90° C./3000 lb making a roughly 2 in. circular film. A strip cut from the thus prepared film was heated for 1 hour at 300° C. under a flow of nitrogen.

A Hastelloy® tube (26 in. long, ⅞ in. I.D., 1 in. O.D) was swept with a slow nitrogen flow as its center 14" was heated using a clamshell Lindberg tube furnace set to 300° C. The first polymer film strip was placed on the flat end of an 18" long stainless steel spatula, that was positioned at roughly the center of the heated area. After 1 hour, the spatula was withdrawn from the heated Hastelloy® tube and the polymer film recovered from the spatula tip. The thus prepared film is herein designated P3-$CF_2CF_2$—P3-6. The nitrogen concentration of the P3-$CF_2CF_2$—P3-6 was found, by the method described supra, to be 251 ppm, an 82% decrease.

Examples 7 and 8

Effect of Pure Cl—F and Effect of Atmosphere on Conversion

A 25 g sample of the P3-CN of Example 6 in the form of fine crumb was added to a 400 ml Hastelloy® autoclave. The autoclave was evacuated and pressured to −6 psig with Cl—F (99% pure, Advance Research Chemicals, Catoosa, Okla.). The contents of the autoclave were agitated as the autoclave was heated to 70° C. over about 45 minutes and then held at 70° C. for 16 hours at an internal pressure of −1 to −2 psig. The polymer thereby prepared, herein designated P3-$CF_2NCl_2$, was recovered and purged with $N_2$ to get rid of residual $Cl_2$ and Cl—F.

A 1 gram sample of the thus prepared P3-$CF_2NCl_2$ polymer was pressed, as described supra, for 3 min/90° C./0 lb, 3 min/90° C./3000 lbs to get an attractive approximately circular film ~1.6 in. in diameter by 0.012 in. thick. A 0.094 g strip cut from the thus prepared film was rolled with 2 g of PF-5052, as described supra, giving partial viscous solution with numerous gel particles over a wide range of sizes, and no retention of the original film shape.

Two additional strips of film were cut from the pressed P3-$CF_2NCl_2$ film prepared above. The first strip (Example 7) weighed 0.0918 g. The first strip was heated at 300° C. for 1 hour using the method of Example 6, under a nitrogen purge. It was found that after treatment the first strip weighed 0.0904 g (a 2% weight loss). Rolling the thus heated first strip with 2 g of PF-5052, as described supra, resulted in a weight gain to 0.2330 g (a 158% weight increase). The strip of film retained its integrity and merely swelled.

The second polymer film strip (Example 8) weighed 0.1238 g. The second strip was subject to the same 300° C. heating for 1 hour as was the first strip except that the nitrogen stream was replaced by an air stream. After treatment, the second strip weighed 0.1219 g (a 2% weight loss). Rolling the thus heated first strip with 2 g of PF-5052, as described supra, resulted in a weight gain to 0.3166 g (a 160% weight increase). Again the strip of film retained its integrity and merely swelled.

Examples 9 and 10

Surface Area Effects on Conversion

A 13 g sample of P3-CN crumb was pressed in a mold 0.060 in. thick by 1.75 in. square for 10 min/125° C./0 lb, 10 min/125° C./5000 lbs. When this amount of material was found to not quite fill the mold another 3 g of polymer were added and the polymer re-pressed for 10 min/150° C./0 lb, 10 min/150° C./5000 lbs.

A five gram sample of the polymer P3-CN in the form of crumb was loaded into a stainless steel Waring blender along with liquid nitrogen and the blender was run until the polymer crumb was reduced to fine granules.

The thus prepared molded sheet and the thus prepared granules were loaded into a 400 ml autoclave. The autoclave was evacuated and then filled with 14 psi of Cl—F (Advance Research Chemicals) bringing pressure in the autoclave to 5 psig. After 91 hours at 22-33° C., the pressure in the autoclave had decreased to 4 psig, and both the granular polymer and the molded sheet were recovered and purged with nitrogen according to the purge method described supra. The molded sheet thus prepared is herein designated P3-$CF_2NCl_2$-9. The granular specimen thus prepared is herein designated P3-$CF_2NCl_2$-10.

ATR spectra were taken of the sheet and granules. The area ratio of the 1036 $cm^{-1}$ band to the 889 $cm^{-1}$ band of the P3-CN polymer granules was 0.7160. P3-$CF_2NCl_2$-10 granules exhibited a 1036/889 $cm^{-1}$ peak ratio of 0.6206. P3-$CF_2NCl_2$-9 molded sheet exhibited a 1036/889 $cm^{-1}$ peak ratio of 0.3144 and 0.3018 for the two sides of the molded sheet. About 14% of the —CN groups in the granules and about 57% of the —CN groups at least at the surface of the thick film were converted to —$CF_2NCl_2$ groups. The —$CF_2NCl_2$ groups show up in the ATR at 960 $cm^{-1}$, the granules having a 960/889 $cm^{-1}$ area ratio of 0.0620 and the two sides of the thick film showing 960/889 $cm^{-1}$ area ratios of 0.1649 and 0.1691.

A 1 gram sample of the P3-$CF_2NCl_2$-10 granules was pressed 3 min/90° C./0 lb, 3 min/90° C./3000 lbs. to get an approximately circular film 1.5 in. in diameter. An ATR spectrum thereof showed the 1036/889 $cm^{-1}$ and 960/889 $cm^{-1}$ area ratios to be 0.6515 and 0.0614 respectively, essentially unchanged from before pressing. A specimen of the P3-$CF_2NCl_2$-10 film was heated for 24 hours at 70° C. under $N_2$ and the ATR spectrum taken again this time showing area ratios 1036/889 $cm^{-1}$=0.6148, 960/889 $cm^{-1}$=0.0880. The 970 $cm^{-1}$ absorption was not detected.

A strip of the thus pressed P3-$CF_2NCl_2$-10 film was heated for 1 hour at 300° C. in a nitrogen purge, according to the method of Example 6. An ATR of the thus heated film, herein designated P3-$CF_2CF_2$—P3-10 showed complete loss of the —$CF_2NCl_2$ group (the 960 $cm^{-1}$ absorption was not detected), replaced by the —$CF_2CF_2$— crosslink (area ratio 970/889 $cm^{-1}$=0.2542). A 0.0860 g strip cut from the P3-$CF_2CF_2$—P3-10 film was rolled with 2 g of PF-5052, as described supra. The weight of the thus rolled strip increased to 0.2500 g (191% weight gain)

A 2.4637 g strip of the P3-$CF_2NCl_2$-9 sheet was heated for 1 hour at 300° C. under $N_2$ using the method of Example 6. The sheet so prepared, herein designated P3-$CF_2CF_2$—P3-9, weighed 2.4487 g. A 0.4793 g piece of the thus prepared P3-$CF_2CF_2$—P3-9 sheet was rolled with 2 g of PF-5052, as described supra. The thus rolled P3-$CF_2CF_2$—P3-9 sheet weighed 2.2264 g (365% weight gain).

Example 11

2.35 wt-% 8-CNVE

Poly(TFE/PMVE/8-CNVE) crumb elastomer that contained 2.35 wt % 8-CNVE, ~49 wt % TFE, ~49 wt % PMVE was prepared according to the method taught in U.S. Pat. No. 5,789,489. The polymer so prepared is herein designated P4-CN. An aliquot of P4-CN was placed into liquid $N_2$ contained in a stainless steel Waring blender, and chopped to finer granules, a mix ranging from dust-like fines up to the rare angular particle ~2-3 mm in diameter. A 400 ml autoclave was loaded with 25 g of the thus granulated P4-CN polymer, the autoclave was evacuated, and 40 psig of the $Cl_2$/Cl—F mixture prepared as in Example 1a was added. The autoclave was heated for 16 hours at 70° C. while its contents were shaken. 24.94 g of partially fused polymer was recovered, herein designated as P4-$CF_2NCl_2$.

A 1 gram sample of the thus prepared P4-$CF_2NCl_2$ polymer was pressed 3 min/90° C./0 lb, 3 min/90° C./5000 lbs to produce a slightly hazy film about 1.9 in. in diameter.

A 0.0841 g slice of the thus pressed P4-$CF_2NCl_2$ film was heated for 1 hour at 300° C. according to the method of Example 6. The thus treated film, herein designated as P4-$CF_2CF_2$—P4-11 weighed 0.0833 g. The thus prepared P4-$CF_2CF_2$—P4-11 film was rolled with 2 g of PF-5052, as described supra. The rolled film weighed 0.2523 g (203% weight gain).

Example 12

Photochemical Conversion of Sheet

A 30 g sample of granulated P3-CN polymer was added to a 400 ml Hastelloy® autoclave. The autoclave was evacuated and pressured to ~24 psig at –10° C. with Cl—F (Advance Research Chemicals). The contents of the autoclave were agitated as the autoclave was heated to 70° C. over about 45 minutes and then held at 70° C. for 16 hours at an internal pressure of 40 to 39 psig. The polymer was recovered and purged with $N_2$ to get rid of residual Cl—F. The thus prepared polymer is herein designated P3-$CF_2NCl_2$-12

A 1.0 gram sample of the thus prepared P3-$CF_2NCl_2$-12 polymer was pressed as described supra, in a hydraulic press: 3 min/120° C./0 lb, 3 min/120° C./3000 lbs thereby preparing a film ranging in thickness from 0.010 to 0.013 in. in thickness and approximately 1.6 in. in diameter, herein designated P3-$CF_2NCl_2$-12a.

A 0.0711 g strip of the thus prepared P3-$CF_2NCl_2$-12a film was heated for 1 hour at 300° C. in an $N_2$ atmosphere according to the method of Example 6. The thus heated film, herein designated P3-$CF_2CF_2$—P3-12a, weighed 0.0698 g. When the 0.0698 g strip of thin film was rolled with 2 g of PF-5052, the weight of the thus rolled strip was 0.1666 g (139% weight gain).

Separately a 12 g sample of the P3-$CF_2NCl_2$-12 polymer was hot pressed in a 2.5" square mold 0.060 in. deep using the following procedure: 5 min/90° C./0 lb, 5 min/90° C./5000 lbs (incompletely fused), 5 min/90° C./0 lb, 5 min/90° C./5000 lbs (still incompletely fused), and finally 10 min/118° C./0 lb and 10 min/118° C./5000 lbs to make a transparent sheet free of unfused particles, herein designated P3-$CF_2NCl_2$-12b.

It was observed that the temperature required to thoroughly fuse the dichloroamino polymers in a practical time frame, such as within an hour or so, increased with the thickness of the specimen. A half inch thick specimen can require a temperature of around 180° C., which will induce crosslinking during melting, significantly degrading the quality of the molded piece.

A 0.2715 g piece was cut off the edge of the 0.060 in. thick P3-$CF_2NCl_2$-12b sheet using scissors. This piece was heated for 1 hour at 300° C. under an $N_2$ atmosphere, according to the method of Example 6. The thus heated piece, herein designated P3-$CF_2CF_2$—P3-12b weighed 0.2669 g. When the thus prepared 0.2669 g piece of P3-$CF_2CF_2$—P3-12b sheet was rolled, as described supra, with 2 g of PF-5052, its weight increased to 0.6703 g (151% weight gain).

A 1 kilowatt Mercury Short Arc Lamp (Advanced Radiation Corporation) was used to irradiate portions of both the P3-CF$_2$NCl$_2$-12a thin film and the P3-CF$_2$NCl$_2$-12b sheet. This lamp delivered a power intensity of 6 milliwatt/cm$^2$ at 365 nm, 10 milliwatt/cm$^2$ at 405 nm, and 6.7 milliwatt/cm$^2$ at 436 nm. Irradiation was carried out on each specimen for 8 hours in a nitrogen atmosphere in a clean room. The resulting specimens are herein designated P3-CF$_2$N=NCF$_2$—P3-12a and P3-CF$_2$N=NCF$_2$—P3-12b.

A 0.1025 g strip cut from the thus prepared P3-CF$_2$N=NCF$_2$—P3-12a film was rolled with 2 g of PF-5052, as described supra. The thus rolled film weighed 0.1784 g (74% weight gain). A 0.3958 g piece cut from the thus prepared P3-CF$_2$N=NCF$_2$—P3-12b sheet was rolled with 2 g of PF-5052, as described supra. The thus rolled sheet weighed 0.7960 g (101% weight gain). The low weight gain in the solvents, and retention of specimen integrity are clear indicators of crosslinking having taken place.

ATR spectra were consistent with crosslinking having occurred to the azo crosslinked material represented by Structure III, but not having progressed further to the perfluoroalkyl-crosslinked material represented by Structure IV, namely, no 970 cm$^{-1}$ band was detected. Further, when a specimen of the irradiated 0.060 in. sheet was subject to heating for 1 hour at 300° C. under N$_2$, according to the method of Example 6, ATR on the thus heated specimen showed that the —CF2CF2- crosslink band at 970 cm$^{-1}$ had appeared with a 970/889 cm$^{-1}$ area ratio of 0.1346. The specimen still showed a small weight gain (117%) and maintenance of integrity upon solvent exposure.

After the UV exposure step, ATR spectra taken on both the top and bottom sides of the P3-CF$_2$N=NCF$_2$—P3-12b sheet showed virtually no remaining —NCl2 groups (peak area ratios at 960/880 cm$^{-1}$=0.0000 and 0.0025 for top and bottom respectively) consistent with essentially complete UV conversion of polymer-NCl2 to polymer-azo-polymer through the full thickness of the specimen.

Example 13

Conversion in Solution

A gelatinous solution was made by rolling 10 g of polymer P1-CN with 90 g of PF-5052, as described supra. The resulting gelatinous solution was charged to a 400 ml autoclave. The autoclave was chilled, evacuated, and 70 psig of the Cl—F/Cl$_2$ mix as prepared in Example 1a, was added at –42° C. The chilling was done to keep the vacuum pump from either pulling the low boiling PF-5052 out of the autoclave or sucking foamed polymer solution down the lines into the pump. The autoclave was shaken for 2 hours at room temperature and then for 2 hours at 70° C. The resulting product was a yellow gel with the consistency of cottage cheese that evaporated down under a nitrogen purge to 9.62 g of white polymer P1-CF$_2$NCl$_2$-13. A 0.035 g aliquot of the thus prepared of P1-CF$_2$NCl$_2$-13 was rolled with 2.6 g of PF-5052. The sample broke up into swollen gel particles as had the starting P1-CN.

A 0.0932 g piece of P1-CF$_2$NCl$_2$-13 was heated for 1 hour using the method of Example 6 except that the temperature was 200° C. instead of 300° C., to prepare a mixture of polymers herein designated P3-CF$_2$NCl$_2$/P3-CF$_2$N=NCF$_2$—P3-13. The P3-CF$_2$NCl$_2$/P3-CF$_2$N=NCF$_2$—P3-13 was rolled with 2.8 g of PF-5052. The thus treated polymer weighed 0.6435 g for a 590% weight gain.

An aliquot of P1-CF$_2$NCl$_2$-13 polymer was mounted in a moving die rheometer (MDR) set at 200° C. The initial torque was just under 1 dNm. After 240 minutes the torque was observed to have increased monotonically to above 8 dNm, and was still increasing, indicating that crosslinking was still not yet complete.

Example 14

Treatment of Hard Plastic

An 400 ml autoclave was chilled to below –20° C. The thus chilled autoclave was then charged with 6.5 ml of 8-CNVE dissolved in 50 ml of Vertrel® XF hydrofluorocarbon fluid from DuPont, 10 ml of Vertrel® XF in which HFPO dimer peroxide was at a concentration of 0.17 M, and 24 g of perfluoro-2,2-dimethyl-1,3-dioxole (PDD). The chilled autoclave was evacuated, and further charged with 9 g of TFE and then sealed.

The thus charged autoclave was shaken at room temperature. The pressure in the autoclave reached a maximum of 24 psig at 18.6° C. at 32 minutes into the run and then decreased to –5 psig at 25.5° C., 1068 minutes later. The reaction product was a polymer wet and swollen with fluid. The reaction product was mixed with 100 ml of acetone and vacuum filtered. The solids residue was rinsed in the filter with an additional 325 ml of acetone. The residue was then sucked dry in the filter, followed by drying overnight in a 50° C. vacuum oven. The yield was 32 g of polymer. Differential Scanning calorimetry (DSC: 10° C./min, N$_2$, 2$^{nd}$ heat) revealed a T$_g$ at 100° C. and another at 207° C. Fluorine NMR found 52.1 mole % TFE, 43.1 mole % PDD, and 4.78 mole % 8-CNVE monomer. Inherent viscosity in perfluoro-N-methylmorpholine at 25° C. was 0.718 dL/g. The polymer thus prepared is herein designated P5-CN-14.

Cl—F Treatment of P5-CN-14.

The P5-CN-14 polymer thus prepared was combined with liquid nitrogen in a stainless steel Waring blender cup, and ground to form granules ranging in size from dust like fines to irregular particles several mm across. A 25.0 g aliquot of the thus granulated granular P5-CN-14 was loaded into a 400 ml autoclave, the autoclave evacuated, and 40 psig of the Cl$_2$/Cl—F prepared as in Example 1a was added at room temperature. The contents of the autoclave were then heated and shaken for 16 hours at 70° C. during which negligible change in pressure was observed. The 24.7 g of P5-CF$_2$NCl$_2$-14 granules recovered from the autoclave were purged with N$_2$ according to the method described supra.

A 0.2 g aliquot of the thus prepared P5-CF$_2$NCl$_2$-14 was rolled with 2 g of PF-5052 as described supra, resulting in a clear, colorless solution. The droplets of the solution were applied to a glass surface using a medicine dropper, forming a film. The film so formed was allowed to air dry sitting in the draft of a fume hood, thereby forming a thin film of P5-CF$_2$NCl$_2$-14.

A 0.0180 g piece cut from the P5-CF$_2$NCl$_2$-14 film was exposed to irradiation for 71 hours under nitrogen with the UV light from a single 2537A Rayonet bulb (approximate intensity at film 0.17 mWatt/cm$^2$), as described supra. The thus irradiated film sample, herein designated P5-CF$_2$N=NCF$_2$—P5 was then rolled with 2 g of PF-5052, as described supra. The P5-CF$_2$N=NCF$_2$—P5 specimen retained its integrity, and increased in weight to 0.0293 g (63% weight gain) rather than dissolving.

A 1 g sample of the granular P5-CF$_2$NCl$_2$-14 was hot pressed 3 min/190° C./0 lb, 3 min/190° C./5000 lbs to make a stiff, approximately circular film 2.1 in. in diameter, referred to herein as the polymer mixture P5-CF$_2$NCl$_2$-14/P5-CF$_2$N=NCF$_2$—P5. Rolling a 0.0511 g strip of the P5-CF$_2$NCl$_2$-14/P5-CF$_2$N=NCF$_2$—P5 film with 2 g of PF-5052 resulted in a gelatinous solution. The term "gelatinous solution" refers to a hazy solution wherein there is evidence of gel (by visual observation: lots of particles, some floating, some stuck to the walls, some particles very small). The liquid phase noticeably increased in viscosity.

An additional 0.0825 g strip of the P5-CF$_2$NCl$_2$-14/P5-CF$_2$N=NCF$_2$—P5 film was heated for 1 hour at 300° C. under N$_2$ according to the method of Example 6, causing it to decrease in weight to 0.0803 g, forming a film herein designated P5-CF$_2$CF$_2$—P5. Rolling the P5-CF$_2$CF$_2$—P5 film with 2 g of PF-5052 caused it to increase in weight to 0.1740 g (117% weight increase).

A fresh 1 g aliquot of the P5-CF$_2$NCl$_2$-14 polymer was pressed as described supra, 3 min/200° C./0 lbs, 3 min/200° C./5000 lbs to give an inhomogeneous looking film that was cut into pieces and pressed a second time for 3 min/220° C./0 lbs, 3 min/220° C./5000 lbs. In this second pressing the polymer was so crosslinked that the pieces failed to fuse together at all.

Example 15

Hydrofluorocarbon Polymer 24 liters of deoxygenated, deionized water was charged to a 33-liter stainless steel reactor equipped with an agitator. Oxygen was displaced from the reactor by a nitrogen sweep, and then the reactor was pressurized to 1.38 MPa with a mixture of 59 mol-% VF$_2$ and 41 mol-% HFP. 400 mL of a 10% ammonium persulfate/10% diammonium phosphate initiator solution was charged to the reactor. The reactor pressure declined due to polymerization and a mixture of 78 mol-% VF$_2$ and 22 mol-% HFP was fed to the reactor to maintain a 1.38 MPa pressure. After 50.0 g of this VF2+HFP monomer mixture had been fed, an 8-CNVE feed was commenced at a rate of 41.5 mL per 3000 g of VF$_2$+HFP monomer mixture. The 8-CNVE feed continued until 5500 g VF$_2$+HFP monomer mixture had been fed, for a total of 75.5 mL 8-CNVE. After 6000 g of VF$_2$+HFP monomer mixture had been fed, the reaction was halted by depressurization of the reactor to obtain a 20.15% solids dispersion with a pH of 4.1. The dispersion was coagulated with magnesium sulfate to give a polymer with a Mooney viscosity, ML-121 (1+10), of 65.6, determined according to ASTM D1646 with a L (large) type rotor at 121° C., using a preheating time of 1 minutes and a rotor operation time of 10 minutes. T$_g$ was determined by DSC to be −18.9° C.

The polymer was estimated by IR to be 76.7 mole % VF$_2$, 22.9 mole % HFP, and 0.4 mole % 8-CNVE (on basis of amount of monomer added to autoclave). The polymer so produced is herein designated P6-CN.

A 1 gram sample of the thus prepared P6-CN was hot pressed for 3 min/90° C./0 lb, 3 min/90° C./5000 lbs to form an approximately circular film 1.6 inches in diameter A 0.078 g strip was cut from the thus formed P6-CN film, and was rolled with 2 g of methyl ethyl ketone (MEK) causing the film to break up into a multitude of swollen gel particles.

A 50 g aliquot of the P6-CN polymer was mixed with liquid N$_2$ and granulated in a stainless steel Waring blender. A 400 ml autoclave at 22° C. was charged with 50 g of the thus formed granules, and then was evacuated. A room temperature Cl$_2$/Cl—F mixture prepared as in Example 1 was then charged to the autoclave to a pressure of 40 psig. The autoclave was shaken for 16 hours at 70° C., the pressure in the autoclave was observed to have dropped from 46 psig observed when the autoclave was initially heated to 70° C. to 42 psig after 16 hours at 70° C. 48.7 g of thus treated granules were recovered, and herein designated P6-CF$_2$NCl$_2$. Some of the granules were observed to have formed agglomerates A 1.0 g aliquot of the thus prepared P6-CF$_2$NCl$_2$ granules were hot pressed for 3 min/90° C./0 lbs, 3 min/90° C./5000 lb resulting in an approximately circular film. A 0.1201 g strip was cut from the P6-CF$_2$NCl$_2$ film, and heated for 1 hour at 300° C. in a N$_2$ atmosphere according to the method of Example 6. The resulting film is designated herein as P6-CF$_2$CF$_2$—P6. The thus prepared P6-CF$_2$CF$_2$—P6 film weighed 0.1194 g. Rolling the P6-CF$_2$CF$_2$—P6 film with 2 g of MEK caused the film to increase in weight to 0.4787 g (302% weight gain).

Example 16

Imageable Article

A 1.0 gram aliquot of the P5-CF$_2$NCl$_2$-14 polymer was dissolved in 18 g of PF-5052, and the resulting solution was filtered using a 0.45 micrometer glass syringe filter. A solution made by diluting 1 ml of this filtrate with 1 ml of Fluorinert FC-40 was spin coated on a clean silicon wafer at 500 rpm for 1 minute. The thus coated silicon wafer was then placed on a 65° C. hot plate until the color of the film stabilized (approximately 30 seconds) as solvent evaporation was completed.

Film Exposure:

A chrome photomask presenting multiple test patterns was pressed lightly on top of the film on the silicon wafer. Mask and wafer were then placed in a N$_2$-purged exposure box and exposed for 730 seconds using a 350 watt high-pressure short-arc lamp with an output of 12 milliwatts/cm$^2$ (OAI Model 200 mask aligner and UV exposure tool that emits UV-A radiation around 360-400 nm). The N$_2$-purged exposure box was next placed under an 8 watt Entela UV lamp for an additional two hours; lamp output was 1.4 mW/cm$^2$ at 365 nm.

Figure 2A:
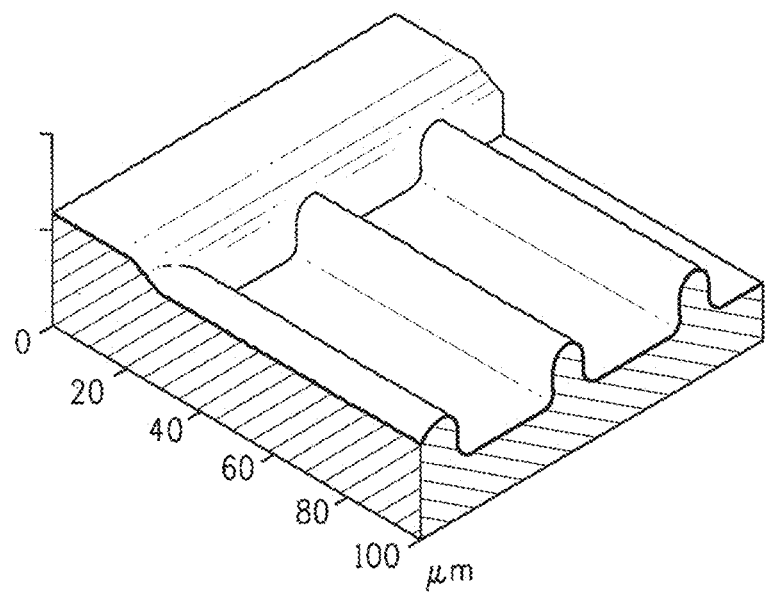
FIG. 2a is an AFM (Atomic Force Microscopy) micrograph of 10 micrometer lines spaced at 20 micrometers developed after exposing the P5CF$_2$NCl$_2$ film in Example 16 to UV light though a photomask.
Figure 2B:
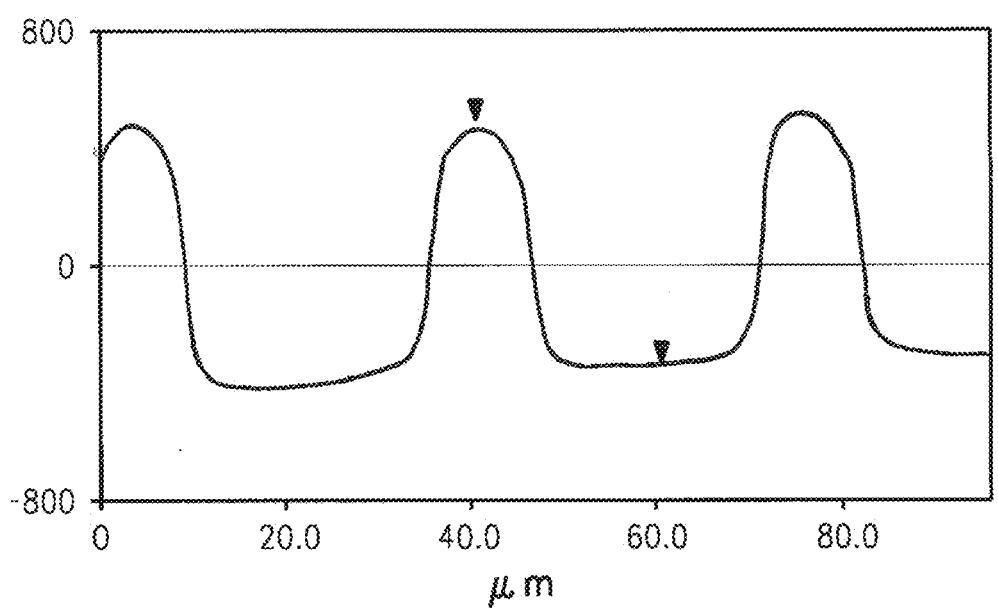
Figure 3A:
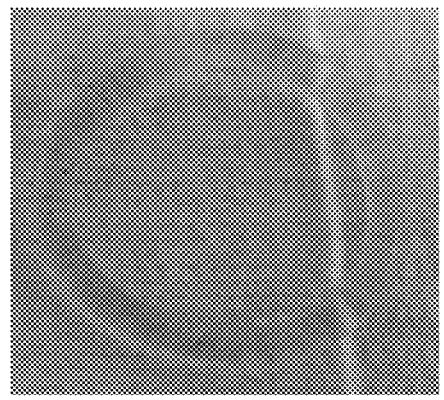
FIG. 3a is an optical photograph of the clear and colorless starting o-ring of P3-CF$_2$CF$_2$—P3-25a of Example 25 before heating in water at 325° C.
Figure 3B:
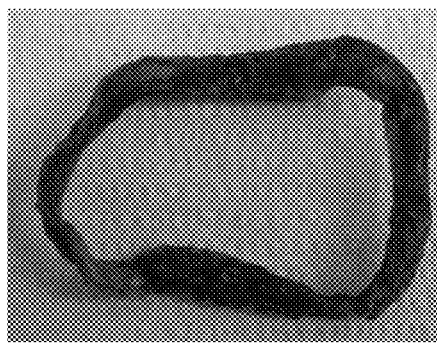
FIG. 3b shows the o-ring of FIG. 3a after heating in water at 325° C.
Figure 4A:
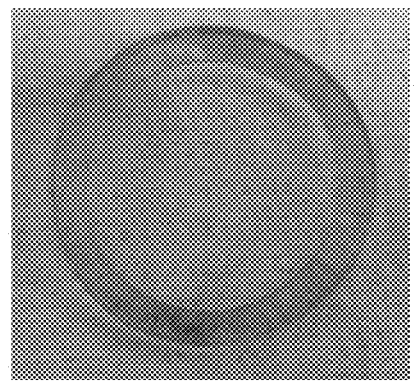
FIG. 4a is an optical photograph of the clear and colorless starting o-ring of P3-CF$_2$CF$_2$—P3-25b of Example 25 before heating in water at 325° C.
Figure 4B:
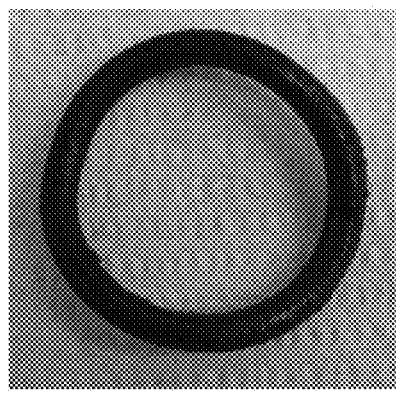
FIG. 4b shows the o-ring of FIG. 4a after heating in water at 325° C.

Pattern Development:

After separating from the photomask, the wafer was agitated for 1-2 minutes in Fluorinert FC-40 solvent in order to remove uncrosslinked, still-soluble polymer. This left UV crosslinked polymer behind on the silicon wafer in the form of raised lines. FIG. 1 is an optical micrograph, taken from above the sample disk. The lines were ca. 20 micrometers and 50 micrometers wide respectively. FIG. 2a shows an Atomic Force Microscopy (AFM) image of the sample in a region having finer lines than in FIG. 1. FIG. 2b shows a so-called sectional analysis of the surface shown in FIG. 2a. Examination of FIGS. 2a and 2b reveals that the raised surface features are about 15 micrometers wide, 800 nanometers high, and 20-25 micrometers apart from one another.

Example 18

Azo to —CF$_2$CF$_2$— Conversion Under Cl$_2$

A. A 5 g film sample P3-CN was placed on a Teflon® FEP film and the two together were positioned into a 400 ml autoclave. The autoclave was evacuated, and then pressured to 40 psig with Cl—F as prepared in Example 1a. The autoclave was heated for 7 hours at 70° C. and 24 hours at 150° C., conditions that created primarily a film designated herein as P3-CF$_2$N=NCF$_2$—P3-18a with some residual P3-CF$_2$NCl$_2$. The thus treated film was recovered and purged with N$_2$ to get rid of residual Cl—F and Cl$_2$. A 0.1929 g strip was cut from the P3-CF$_2$N=NCF$_2$—P3-18a film, and was heated for 1 hour at 300° C. under a N$_2$ flow according to the method of Example 6, to produce a strip of film herein designated P3-CF$_2$CF$_2$—P3-2-18a. The P3-CF$_2$CF$_2$—P3-18a strip was rolled with PF-5052, as described supra. The weight of the thus rolled strip was 0.4632 g (140% weight gain).

B. Completion of Crosslinking at 300° C. Under Cl$_2$ Gas.

The procedures of Example 18 part A were repeated with a fresh 5 g film sample of P3-CN to produce a new film sample of P3-CF$_2$N=NCF$_2$—P3-18b with residual P3-CF$_2$NCl$_2$. However, instead of recovering the thus prepared film at this point, the autoclave was evacuated and pressured to 10 psig with Cl$_2$. The autoclave was then heated for 1 hour at 300° C., generating an internal Cl$_2$ pressure of 33 psig. The film strip thus prepared is herein designated P3-CF$_2$CF$_2$—P3-2-18b. A 0.3915 g strip was cut from the P3-CF$_2$CF$_2$—P3-2-18b film, and was rolled with 2 g of PF-5052, as described supra. The thus rolled film weighed 0.3915 g (137% weight gain).

Example 19

Crosslink Stability Under F$_2$

A 15.2 g sample of polymer P3-CN crumb was pressed in a mold for 10 min/125° C./0 lb, 10 min/125° C./5000 lbs to make a sheet 1.75 in. square by 0.160 in. thick. The sheet so prepared was yellow with faint brown speckling. The sheet so prepared was placed flat on a Hastelloy® sheet, and, together, they were placed into a 400 ml autoclave. The autoclave was evacuated. Pressure in the clave brought from –14 to 0 psig with Cl—F (Advance Research Chemicals). The autoclave was heated in the following series of steps: 1 hr at 75° C., 1 hr at 100° C., 1 hr at 125° C., 1 hr at 150° C., 1 hr at 175° C., and 6 hrs at 200° C. The autoclave was cooled back to room temperature, purged of Cl—F, opened and 10 ml of PF-5052 added avoiding physical contact of the liquid PF-5052 with the polymer. The clave was evacuated and pressure in the clave brought from –11 to 4 psig with Cl—F. The clave was heated in the following series of steps: 4 hrs at 75° C., 4 hrs at 100° C., 4 hrs at 125° C., 4 hrs at 150° C., 4 hr at 175° C., and 30 hrs at 200° C. The sheet so prepared is herein designated P3-CF$_2$N=NCF$_2$—P3/P3-CF$_2$CF$_2$—P3-19. Upon recovery, the film weighed 20.1 g, the weight increase being caused by the absorption of PF-5052. Absorbed PF-5052 was removed by heating for 68 hours in a 100° C. vacuum oven with a N$_2$ bleed. At this point the film was a pale uniform yellow with no sign of the brown speckling.

A 0.1710 gram piece was cut off the edge of the film and rolled with 2 g PF-5052 causing its weight to increase to 0.3906 g (128% weight gain). The 970/889 cm$^{-1}$ area ratio in the ATR characteristic of the —CF$_2$CF$_2$— crosslinks was 0.24.

Reaction with F$_2$:

A square corner weighing 3.3764 g was cut off from the P3-CF$_2$N=NCF$_2$—P3/P3-CF$_2$CF$_2$—P3-19 film, and was placed flat on a Hastelloy® sheet that was then inserted into a 400 ml Hastelloy® autoclave. The autoclave was then evacuated. Pressure within the autoclave was raised from –13 to 6 psig with a gaseous mixture of 25 mol-% F$_2$ in nitrogen. The autoclave was heated for roughly 1 hr at 75° C., 1 hr at 100° C., 1 hr at 125° C., 1 hr at 150° C., 1 hr at 175° C., and 6 hrs at 200° C. The recovered film weighed 3.3119 g and was bleached colorless. A 0.2274 g piece cut off the edge of the film was rolled with 2 g PF-5052 increasing its weight to 0.6680 g (194% weight gain). ATR found a 970/889 cm−1 area ratio of 0.24, exactly the same as before fluorine treatment.

Example 20

Thickness Effect

A. Five 13 gram samples of P3-CN crumb were pressed in a mold for 10 min/120° C./0 lb, 10 min/120*C/5000 lbs to make five sheets, each 2.5 inches square by 0.060 in. thick. Disks 15 mm in diameter by 0.060 in. thick were cut out using a die. A pellet mold was made in the cavity of a press by stacking in succession a steel plate, a Kapton® film, a 0.5" thick steel plate having a 0.75 in. diameter circular hole with adjoining overfill cavities, a second Kapton film, and a third steel plate. The mold was preheated to 180° C. in a heated hydraulic press. Seven to eight grams of the circular P3-CN disks were loaded into the preheated mold cavity. The upper Kapton® film and steel plate were set in place and the platens of the press closed only to contact pressure. The thus filled mold equilibrated for 5 minutes under contact pressure, and then 30,000 lbs of ram force was applied for 2 minutes. The mold was removed from the press, and the pellet thus formed was removed once the mold had cooled back to ambient. Molded pellets typically measured about 0.75 inch high by 0.5 inch wide and weighed about 6.75 g.

Seven such pellets were prepared. The pellets so prepared were slightly yellow in color, had occasional black spots, and occasional bubbles. The pellets so prepared are herein designated P3-CN-20a B. Two P3-CN-20 pellets were loaded into a 400 ml autoclave, the autoclave was evacuated, and then filled with 2 g of Cl—F (Advance Research Chemicals). The autoclave was then heated in the following series of steps: 7 hours at 75° C., 2 hours at 100° C., 2 hours at 125° C., 2 hours at 150° C., 2 hours at 175° C., 2 hours at 200° C., 2 hours at 250° C., and 2 hours at 300° C. with pressure in the autoclave observed to increase from at 12 psig at 22.1° C. to 37 psig at 300.6° C. The autoclave was cooled to room temperature, the pellets recovered and purged with nitrogen for 70 hours. The pellets so treated, herein designated P3-CF$_2$CF$_2$—P3-20b, appeared to be unchanged in shape except for some internal bubble formation. One of the pellets, a pellet with a few bubbles between two of the layers that had been pressed together to make the pellet, was cut longitudinally through its center traversing the 0.5" distance from top to bottom. ATR was then used to measure the intensities of the 970 cm$^{-1}$ and 889 cm$^{-1}$ absorption bands approximately every mm from the top to the bottom of the cut with the results shown in Table 3. Significant —$CF_2CF_2$ crosslink formation as measured by ATR absorption at 970 cm$^{-1}$ was observed only to a depth of 2-3 mm along the cross sectional cut.

TABLE 3

| Distance from | Peak Area Ratio 970 cm$^{-1}$/889 cm$^{-1}$ | |
| --- | --- | --- |
| Top (mm) | Example 20 | Example 21 |
| 0 | 0.1442 | 0.4050 |
| 1 | 0.0298 | 0.5436 |
| 2 | 0.0394 | 0.8253 |
| 3 | 0.0429 | 0.7551 |
| 4 | 0.0553 | 0.8487 |
| 5 | 0.0588 | 1.0176 |
| 6 | 0.0509 | 0.9157 |
| 7 | 0.0545 | 0.8655 |
| 8 | 0.3811 | 0.7156 |
| 9 | 0.4616 | 0.6862 |
| 10 | 0.5029 | 0.4032 |

Nitrogen analysis of a specimen cut from the surface of a P3-$CF_2CF_2$—P3-20b pellet found 56 ppm N in P3-$CF_2CF_2$—P3-19a vs. 1381 ppm N in P3-CN starting polymer.

Example 21

Solvent Assisted Diffusion of Reactants

A. One of the P3-CN-20a pellets was loaded into a 400 ml autoclave, the autoclave was evacuated, and then filled with 2 g of Cl—F (Advance Research Chemicals). The autoclave was then heated in the following series of steps: 1 hour at 75° C., 1 hour at 100° C., 1 hour at 125° C., 1 hour at 150° C., 1 hour at 175° C., and 6 hours at 200° C. The autoclave was vented, purged with nitrogen, evacuated, and then 10 ml of PF-5052 was injected followed by addition of 2 g of Cl—F (Advance Research Chemicals). The autoclave was again heated, in the following series of steps: 1 hour at 75° C., 1 hour at 100° C., 1 hour at 125° C., 1 hour at 150° C., 1 hour at 175° C., 1 hour at 200° C., 2 hours at 250° C., and 2 hours at 300° C. Pressure in the autoclave was observed to increase to 105 psig at 300.8° C. The pellet so treated, herein designated P3-$CF_2CF_2$—P3-21 b, was observed to have been bleached colorless throughout. After purging with nitrogen in the manner described supra to get rid of absorbed solvent and residual Cl—F, the pellet was sliced longitudinally through its center traversing the 0.5 inch distance from top to bottom. ATR was then used to measure the relative intensities of the 970 cm$^{-1}$ band, and the 889 cm$^{-1}$ bands approximately every mm from the top to the bottom of the cut. The data is shown in Table 3.

A further 0.0972 g chunk, designated P3-$CF_2CF_2$—P3-21c, was cut from the P3-CF2CF2-P3-21b pellet, carving the chunk out of the extreme center of the cross-sectioned face. Rolling P3-$CF_2CF_2$—P3-21c with 2 g of PF-5052 caused it to increase in weight to 0.4269 g (339% weight gain). A 0.2393 g piece of skin, designated P3—$CF_2CF_2$—P3-21 d, was cut off the outer, cylindrical wall of the pellet P3-$CF_2CF_2$—P3-21 b. Rolling P3-$CF_2CF_2$-20d with 2 g of PF-5052 caused it to increase in weight to 0.9289 g (288% weight gain).

Example 22

Secondary —CN Group $CF_2$=$CFO(CF_2)_3OCF(CF_3)CN$, herein designated "i-8CNVE," was prepared according to the method described in European Patent Application 710645, 8 May 1996

Three aqueous streams were each fed continuously to a 1 liter mechanically stirred, water jacketed, stainless steel autoclave at a rate of 81 cc/hr. The first stream consisted of 1.34 g ammonium persulfate, 26.2 g of disodium hydrogen phosphate heptahydrate, and 30 g ammonium perfluorooctanoate per liter of de-ionized water. The second stream consisted of 30 g of ammonium perfluorooctanoate per liter of de-ionized water. The third stream consisted of 1.34 g of ammonium persulfate and 30 g ammonium perfluorooctanoate per liter of de-ionized water. Using a diaphragm compressor, a mixture of TFE (58.5 g/hr) and PMVE (68.8 g/hr) was fed at constant rate. The liquid i-8CNVE was fed as a separate stream at a rate of 3.5 g/hr. The reaction temperature was maintained at 85° C., the pressure at 4.1 MPa (600 psi), and the pH at 4.2 throughout the reaction. The polymer emulsion was removed continuously by means of a letdown valve and the unreacted monomers were vented. The polymer was isolated from the emulsion by first diluting it with deionized water at the rate of 8 liter deionized water per liter of emulsion, followed by addition of 320 cc of a magnesium sulfate solution (100 g magnesium sulfate heptahydrate per liter of deionized water) per liter of emulsion at a temperature of 60° C. The resulting slurry was filtered, and the polymer solids obtained from a liter of emulsion were re-dispersed in 8 liters of deionized water at 60° C. After filtering, the wet crumb was dried in a forced air oven for 48 hr at 70° C. Polymer yield was about 124 g per hour of reactor operation. The polymer composition, analyzed using FTIR, was 56.8 wt % (45.1 mole %) PMVE, 2.09 wt % (0.71 mole %) i-8CNVE, the remainder being tetrafluoroethylene. A parallel analysis by NMR found 51.4 wt % PMVE, 46.7 wt % TFE, and 1.938 wt % i-8CNVE [39.6 mole % PMVE, 59.7 mole % TFE, and 0.637 mole % i-8CNVE)]. The polymer had an inherent viscosity of 0.55 measured in a solution of 0.1 g polymer in 100 g of solvent consisting of a 60/40/3 volume ratio of hepta-fluoro-2,2,3-trichlorobutane, perfluoro(butyltetrahydrofuran) and ethylene glycol dimethyl ether. Mooney viscosity, ML (1+10), was 35.2, as determined according to ASTM D1646 with an L (large) type rotor at 175° C., using a preheating time of one minute and rotor operation time of 10 minutes. The polymer thus prepared is herein designated P7-CN A 2.17 g aliquot of P7-CN, was pressed 3 min/90° C./0 lbs, 3 min/90° C./4000 lbs to get an approximately 2.1 in diameter circle 0.016-0.021 in. thick. A 0.1436 g strip cut from the P7-CN film gave a clear solution when rolled for 2 hours with PF-5052.

A 0.54 g strip cut from the P7-CN film was placed flat on a Hastelloy® sheet, and together they were positioned in a 400 ml Hastelloy® autoclave, the autoclave evacuated, and then pressured from −13 to 2 psig with Cl—F (Advance Research Chemicals). The autoclave was heated for approximately 10 hours at 70° C. The recovered film, herein designated P7-CF$_2$NCl$_2$ weighed 0.54 g. A 0.1905 g strip cut from the P7-CF$_2$NCl$_2$ film was heated for 1 hour at 300° C. under nitrogen, thereby preparing a film strip herein designated P7-CF$_2$CF$_2$—P7-22. The weight of the P7-CF$_2$CF$_2$—P7-22 strip was 0.1918 g. The P7-CF$_2$CF$_2$—P7-22 strip was rolled with 2 g PF-5052 for 24 hours, the strip still retained its shape; the weight after rolling was 1.1556 g (502% weight gain).

Example 23

Blend Where Monomer Units Differ

A. A 0.5 g aliquot of P4-CF$_2$NCl$_2$ granules was placed atop a 0.5 g piece of P2-CF$_2$NCl$_2$ film. The sample so prepared was pressed in the configuration described supra under "Sample Preparation at 3 min/50° C./0 lb, 3 min/50° C./3500 lbs." The resulting film was cut up and re-pressed at 3 min/50° C./0 lb, 3 min/50° C./5000 lbs. The resulting film was again cut up and re-pressed at 3 min/50° C./0 lb, 3 min/50° C./5000 lbs at which point the film appeared homogeneous to the naked eye. The final resulting film, herein designated P2-CF$_2$NCl$_2$/P4-CF$_2$NCl$_2$-23 was approximately circular with a diameter of approximately 2 in.

B. A 0.0743 g strip cut from the P2-CF$_2$NCl$_2$/P4-CF$_2$NCl$_2$-23 film was heated for 1 hour at 300° C. under a nitrogen flow using the method of Example 6. The strip of film so processed, herein designated P2-CF$_2$CF$_2$—P4-23 weighed 0.0685 g. When rolled with 2 g of PF-5052, the strip of film increased in weight to 0.1153 g, a 68% weight gain. While designated P2-CF2CF2-P4-23 to highlight the bonding that occurred between the two blended components, the film should also contain P2-CF$_2$CF$_2$—P2 as well as P4-CF$_2$CF$_2$—P4 crosslinked species as well.

Example 24

Blend Where Monomer Units are the Same

A 0.5 g sample of P4-NCl$_2$ was mixed with a 0.5 g sample of P5-NCl$_2$. This mixture was pressed, as described for the mixture in Example 23, at 3 min/90° C./0 lbs and 3 min/90° C./10,000 lbs. The pressing sequence was repeated twice, each time the resulting film being cut up between pressings. In the third pressing a circular film 2" in diameter was prepared, herein designated P4-CF$_2$NCl$_2$/P5-CF$_2$NCl$_2$-24. A 0.0680 g strip cut from the P4-CF$_2$NCl$_2$/P5-CF$_2$NCl$_2$-24 film was heated for 1 hour at 300° C. under N$_2$. The weight of the resulting film, herein designated P4-CF$_2$CF$_2$—P5-24, was 0.0670 g. Rolling the P4-CF$_2$CF$_2$—P5-24 strip with 2 g of PF-5052 resulted in a strip weighing 0.1700 g, a weight gain of 154%. It is expected that the P4-CF$_2$CF$_2$—P5 film was intermixed with P4-CF$_2$CF$_2$—P4 and P5-CF$_2$CF$_2$—P5 moieties.

Example 25

Stabilization Effect

A sample of P3-CN was hot pressed for 15 minutes in a 180° C. mold to make a yellowed o-ring with brownish flecks, herein designated P3-CN-25a. The P3-CN-25a o-ring so prepared had a 1.25 in. outer diameter (O.D.), a 0.139 in. thickness, and weighed 1.8422 g. The P3-CN-25a o-ring was placed in a 400 ml Hastelloy® autoclave, and the autoclave was evacuated. Pressure in the autoclave was increased from −14 to −5 psig by the addition of 0.5 g of Cl—F (Advance Research Chemicals). The autoclave was held for 2 hrs at room temperature, then heated as follows: 2 hrs at 75° C., 2 hrs at 125° C., 2 hrs at 150° C., 2 hrs at 175° C., and 16 hrs at 200° C., followed by cooling to room temperature. The o-ring was recovered and then heated for 1 hour at 300° C. in an air oven to complete conversion to P3-CF$_2$CF$_2$—P3-25a, which was largely clear and colorless.

The P3-CF$_2$CF$_2$—P3-25a o-ring was placed into a 400 ml Hastelloy® autoclave with 180 ml of water, and the autoclave was evacuated. The autoclave was then heated to 325° C. and held for 1 week at 325° C. followed by cooling to room temperature. The recovered o-ring was about 1.7 in. O.D., and was flattened like a ribbon. In appearance, it was noticeably brown and foamed. The o-ring weighed 2.1162 g (a 15% weight gain).

A second o-ring of P3-CN, herein designated P3-CN-25b, was prepared in an identical manner to that of P3-CN-25a, and exhibited identical initial dimensions. The P3-CN-25b o-ring weighed 1.8656 g. The P3-CN-25b o-ring was added to a 400 ml Hastelloy® autoclave, and the autoclave was evacuated. The pressure in the autoclave was increased from −11 to 1 psi by the addition of Cl—F (Advance Research Chemicals). The autoclave was held for 2 hrs at r.t., then heated as follows: 2 hrs at 75° C., 2 hrs at 125° C., 2 hrs at 150° C., 2 hrs at 175° C., 4 hrs at 200° C., and 4 hours at 250° C. The recovered o-ring, herein designated P3-CF$_2$CF$_2$—P3-25b, was clear and colorless.

P3-CF$_2$CF$_2$—P3-25b was treated in water in a manner identical to that of P3-CF$_2$CF$_2$—P3-25a. The recovered o-ring came back unchanged in dimensions, black, and with its surface noticeably roughened. It weighed 1.9277 g (3% weight gain). The o-ring was still flexible and elastic.

What is claimed is:
1. An azo-crosslinked polymer represented by Structure III

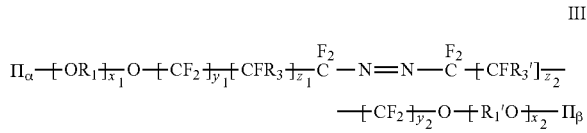

wherein each of $\Pi_\alpha$ and $\Pi_\beta$ is a polymeric radical having a backbone chain comprising fluoroalkylene repeat units optionally substituted by ether oxygen, and azo-crosslinked repeat units at a molar concentration in the range of a molar concentration of 0.5 to 50 mol-%; where $x_1$ and $x_2$ each independently is an integer in the range of 0 to 3; $y_1$ and $y_2$ each independently is an integer in the range of 0 to 6, and $z_1$ and $z_2$ each independently is an integer in the range of 0 to 3; $R_1=(CF_2)_a CFR_2$, where a is an integer in the range of 0 to 6, and $R_2$ is F or $C_{1-6}$ perfluoroalkyl optionally substituted by ether oxygen; $R_1'=(CF_2)_{a'} CFR_2'$ where a' is an integer in the range of 0 to 6, and $R_2'$ is F or $C_{1-6}$ perfluoroalkyl optionally substituted by ether oxygen; and, $R_3$ and $R_3'$ are each independently F or $C_{1-6}$ perfluoroalkyl optionally substituted by ether oxygen; with the proviso that $y_1$ and $z_1$ cannot both be zero; with the further proviso that $y_2$ and $z_2$ cannot both be zero; with the further proviso that no repeat unit in the backbone chain of said $\Pi_\alpha$ and $\Pi_\beta$ polymeric radicals has more than two vinyl hydrogens attached thereto; and, with the further proviso that $\Pi_\alpha$ and $\Pi_\beta$ can be the same or different.

2. The azo-crosslinked polymer of claim 1 wherein $\Pi_\alpha$ and $\Pi_\beta$ are the same.

3. The azo-crosslinked polymer of claim 2 wherein $x_1$, $x_2$, $y_1$, $y_2$, $z_1$, $z_2$, a and a'=1; $R_2$ and $R_2'=CF_3$; and $R_3$ and $R_3'=F$.

4. The azo-crosslinked polymer of claim 1 wherein $\Pi_\alpha$ and $\Pi_\beta$ are different.

5. The azo-crosslinked polymer of claim 1 wherein the fluoroalkylene repeat units comprise a combination of TFE and PDD repeat units.

6. The azo-crosslinked polymer of claim 1 wherein at least one of $\Pi_\alpha$ and $\Pi_\beta$ further comprises perfluoroalkyl vinyl ether repeat units.

7. An azo formation process for preparing the azo-crosslinked polymer of claim 1 comprising combining a first dichloroamino-functionalized polymer having a first backbone chain and a second dichloroamino-functionalized polymer having a second backbone chain to form a reaction mixture, and subjecting said thus formed reaction mixture to exposure to ultra-violet irradiation, at least a portion of which lies in the wavelength range from 200 to 425 nm for a period of time sufficient to convert at least a portion of said first and second polymers into a crosslinked product, each said first and second backbone chains comprising fluoroalkylene repeat units optionally substituted by ether oxygen, and a molar concentration in the range of a molar concentration of 0.5 to 50 mol-% of dichloroamino-functionalized repeat units represented by Structure I

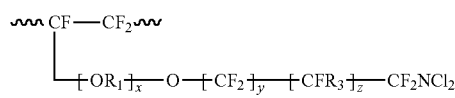

where x is an integer in the range of 0 to 3, y is an integer in the range of 0 to 6, and z is an integer in the range of 0 to 3; R1=(CF2)aCFR2, where a is an integer in the range of 0 to 6, and R2 is F or C1-6 perfluoroalkyl optionally substituted by ether oxygen; R3 is F or C1-6 perfluoroalkyl optionally substituted by ether oxygen; with the proviso that y and z cannot both be zero; and, with the further proviso that no repeat unit in the backbone chain of said dichloroamino-functionalized polymer has more than two vinyl hydrogens attached thereto; and, wherein said dichloroamino-functionalized polymer has no crystalline melting point above 180° C. that is associated with a latent heat of melting greater than 1 J/g; and, wherein said first polymer and said second polymer can be the same or different.

8. The azo formation process of claim 7 wherein said first dichloroamino-functionalized polymer and second dichloroamino-functionalized polymer are the same.

9. The azo formation process of claim 8 wherein x=1, y=1, z=1, and a=1; R2=CF3; and R3=F.

10. The azo formation process of claim 7 wherein said first dichloroamino-functionalized polymer and second dichloroamino-functionalized polymer are different.

11. The azo formation process of claim 7 wherein the fluoroalkylene repeat units comprise a combination of TFE and PDD repeat units.

12. The azo formation process of claim 7 wherein at least one of said first dichloroamino-functionalized polymer and second dichloroamino-functionalized polymer further comprises perfluoroalkyl vinyl ether repeat units.

13. The azo formation of process of claim 7 further comprising filmwise disposing the dichloroamino-functionalized polymers upon a substrate.

14. The azo formation process of claim 13 further comprising imagewise exposure of the filmwise disposed dichloroamino-functionalized polymers to the ultra-violet radiation.

15. An azo formation process for preparing the azo-crosslinked polymer of claim 1 comprising subjecting to ultra-violet irradiation in the wave-length range from 250-370 nm, a dichloroamino-functionalized polymer having a backbone chain for a period of time sufficient to convert at least a portion of said dichloroamino-functionalized polymer into a crosslinked product; said backbone chain comprising repeat units of tetrafluoroethylene, perfluoromethylvinyl ether, and a molar concentration in the range of 0.5 to 5 mol-% of dichloroamino-functionalized repeat units represented by Structure V

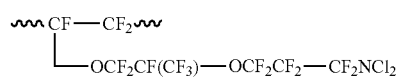

wherein said dichloroamino-functionalized polymer has no crystalline melting point above 150° C. that is associated with a latent heat of melting greater than 1 J/g.

16. The azo formation of process of claim 15 further comprising filmwise disposing the dichloroamino-functionalized polymer upon a substrate.

17. The azo formation process of claim 16 further comprising imagewise exposure of the filmwise disposed dichloroamino-functionalized polymer to the ultra-violet radiation.

18. azo-crosslinked polymer represented by Structure VII:

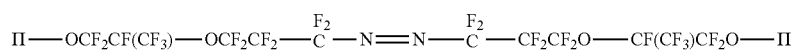

wherein $\pi$ is a polymeric radical having a backbone chain comprising repeat units of tetrafluoroethylene, perfluoromethyvinyl ether, and azo-crosslinked repeat units at a molar concentration of 0.5 to 5 mol-%.

* * * * *